US012334721B2

(12) United States Patent
Liu et al.

(10) Patent No.: US 12,334,721 B2
(45) Date of Patent: Jun. 17, 2025

(54) OVERCURRENT PROTECTION CIRCUIT AND DISPLAY DEVICE

(71) Applicant: SEEYA OPTRONICS CO., LTD., Shanghai (CN)

(72) Inventors: Ping-lin Liu, Shanghai (CN); Tong Wu, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 524 days.

(21) Appl. No.: 17/865,679

(22) Filed: Jul. 15, 2022

(65) Prior Publication Data

US 2023/0208129 A1  Jun. 29, 2023

(30) Foreign Application Priority Data

Dec. 29, 2021 (CN) .......................... 202111636525.0

(51) Int. Cl.
*H02H 3/08* (2006.01)
*H02H 1/00* (2006.01)
(Continued)

(52) U.S. Cl.
CPC ............ *H02H 3/08* (2013.01); *H02H 1/0007* (2013.01); *H02H 3/02* (2013.01); *H03K 17/082* (2013.01)

(58) Field of Classification Search
CPC .......... H02H 3/08; H02H 3/02; H02H 1/0007; H03K 17/082
(Continued)

(56) References Cited

U.S. PATENT DOCUMENTS 8,531,170 B2 * 9/2013 Fukami .............. H03K 17/0822
323/313
9,886,045 B2 * 2/2018 Endo ....................... G05F 1/575
(Continued)

FOREIGN PATENT DOCUMENTS

CA     2099733    12/1993
CN    101165983    4/2008
(Continued)

OTHER PUBLICATIONS

Chinese Office Action Dated Jul. 26, 2023 For Corresponding Chinese Patent Application No. 202111636525.0.

*Primary Examiner* — Jared Fureman
*Assistant Examiner* — Lucy M Thomas
(74) *Attorney, Agent, or Firm* — DUANE MORRIS LLP

(57) ABSTRACT

Provided are an overcurrent protection circuit and a display device, where the overcurrent protection circuit includes a drive transistor, an operational amplifier, a buffer, a peak current detector, and a peak current controller; the output terminal of the operational amplifier is connected with the buffer, and the operational amplifier controls the drive transistor through the buffer; the output terminal of the peak current controller is electrically connected with the gate control terminal of the buffer; when the peak current detector does not detect an overload current, the peak current detector controls the operational amplifier to control the gate of the drive transistor; when the peak current detector detects an overload current, the peak current detector controls the peak current controller to control the gate of the drive transistor to maintain the overcurrent protection circuit to work.

19 Claims, 10 Drawing Sheets

(51) Int. Cl.
    *H02H 3/02*         (2006.01)
    *H02H 9/02*         (2006.01)
    *H03K 17/082*     (2006.01)

(58) Field of Classification Search
    USPC .................................................... 361/93.1
    See application file for complete search history.

(56) References Cited

U.S. PATENT DOCUMENTS

2006/0133000 A1\*   6/2006   Kimura ................. G05F 1/5735
                                                             361/93.1
2021/0167684 A1\*   6/2021   Matsumoto ............. H02M 1/32

FOREIGN PATENT DOCUMENTS

| CN | 104536507 | 4/2015 |
| --- | --- | --- |
| CN | 109980915 | 7/2019 |
| CN | 111133650 | 5/2020 |

\* cited by examiner

OVERCURRENT PROTECTION CIRCUIT AND DISPLAY DEVICE

CROSS-REFERENCE TO RELATED APPLICATION(S)

This application claims priority to Chinese Patent Application No. 202111636525.0 filed Dec. 29, 2021, the disclosure of which is incorporated herein by reference in its entirety.

TECHNICAL FIELD

The present disclosure relates to the field of display techniques and, in particular, to an overcurrent protection circuit and a display device.

BACKGROUND

When the output is short-circuited or overloaded, the system or load will be protected, that is, overcurrent protection (OCP). FIG. 1 is a circuit diagram of an overcurrent protection circuit in the related art. In FIG. 1, MS' is a current detect transistor, and transistors MF', M1' and M2' and a current sampling resistor Rs' constitute a protection circuit. The resistor string composed of resistors $R_{F1}'$ and $R_{F2}'$ is in the same branch as the transistor MP', one terminal where the resistors $R_{F1}'$ and $R_{F2}'$ are connected serves as a feedback point and is electrically connected with the inverting input terminal of the operational amplifier U1', and the non-inverting input terminal of the operational amplifier U1' is electrically connected with the reference voltage terminal VREF. The width-to-length ratio of the transistor MP' is K times the width-to-length ratio of the current probing transistor MS', and the current Is of the current sampling resistor Rs' is approximately 1/K times the output stage current $I_1$ of the overcurrent protection circuit. The voltage at point A is proportional to the current Is. During normal working, the gate-to-source voltage of the transistor MF' is:

$$V_{GSF} = Is*Rs' < V_{THF}.$$

$V_{THF}$ is the threshold voltage of the transistor MF', so transistors MF', M1' and M2' are off. When the overcurrent is loaded, that is, when the output current increases sharply to a certain set value, the voltage at point A increases enough to turn on the transistor MF', the feedback current is replicated to the transistor M2' through the transistor M1', and the transistor M2' pulls up the voltages of the gates of the transistor MP' and the current detect transistor MS' to limit the output current. The power consumption of the overcurrent protection circuit in the related art is large, and when the current is overloaded, the overcurrent protection circuit is directly turned off and thus cannot be returned to normal work after the overload is released.

SUMMARY

The present disclosure provides an overcurrent protection circuit and a display device, so that the overcurrent protection circuit has low power consumption, the voltage and current are effectively limited when the current is overloaded, and the normal working voltage can be restored after the overload of the output terminal of the overcurrent protection circuit is released.

In a first aspect, an embodiment of the present disclosure provides an overcurrent protection circuit. The overcurrent protection circuit includes a drive transistor, an operational amplifier, a buffer, a peak current detector, and a peak current controller.

The gate of the drive transistor is electrically connected with the gate control terminal of the buffer, the first electrode of the drive transistor is electrically connected with a first power terminal, and the second electrode of the drive transistor is electrically connected with the output terminal of the overcurrent protection circuit.

The output terminal of the operational amplifier is connected with the buffer, and the operational amplifier controls the drive transistor through the buffer.

The output terminal of the peak current controller is electrically connected with the gate control terminal of the buffer.

The peak current detector is used for detecting whether an overload current exists at the output terminal of the overcurrent protection circuit, when no overload current is detected, the peak current detector controls the operational amplifier to control the gate of the drive transistor, and when an overload current is detected, the peak current detector controls the peak current controller to control the gate of the drive transistor to maintain the overcurrent protection circuit to work.

In a second aspect, an embodiment of the present disclosure provides a display device. The display device includes the overcurrent protection circuit described in the first aspect.

The overcurrent protection circuit provided by the present disclosure includes a peak current detector and a peak current controller. The peak current detector is used for detecting the current of the output terminal of the overcurrent protection circuit, and when the current of the output terminal of the overcurrent protection circuit is overloaded, controlling the peak current controller to be turned on to maintain the overcurrent protection circuit to work. When the overload current disappears, the peak current detector detects that the current of the output terminal of the overcurrent protection circuit drops, controls the operational amplifier to control the gate of the drive transistor, returns the initiative of the overcurrent protection circuit to the main loop controlled by the operational amplifier, and restores the voltage of the output terminal of the overcurrent protection circuit to the set voltage. The overcurrent protection circuit provided by the embodiment of the present disclosure enables the overcurrent protection circuit to have low power consumption, the voltage and current to be effectively limited when the current is overloaded, and the normal working voltage to be restored after the overload of the output terminal of the overcurrent protection circuit is released.

DETAILED DESCRIPTION

Figure 1:
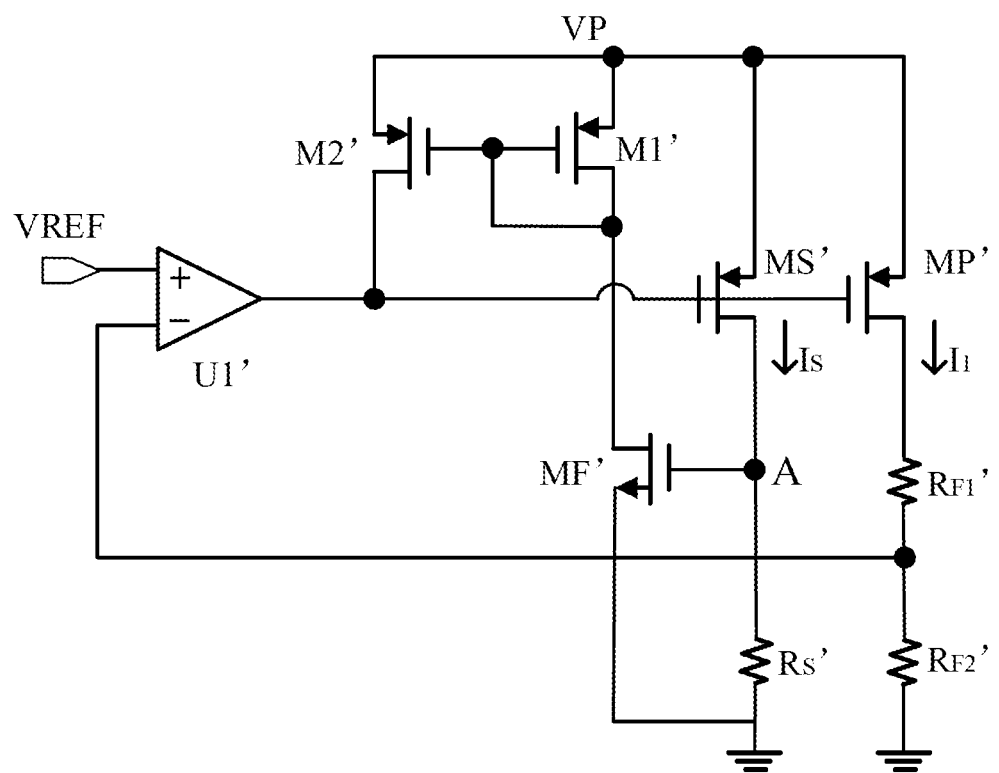
FIG. 1 is a circuit diagram of an overcurrent protection circuit in the related art.

The present disclosure is further described hereinafter in detail in conjunction with drawings and embodiments. It is to be understood that embodiments described hereinafter are merely intended to explain the present disclosure and not to limit the present disclosure. Additionally, it is to be noted that for ease of description, only part, not all, of structures related to the present disclosure are illustrated in the drawings.

For the problems in the related art, an embodiment of the present disclosure provides an overcurrent protection circuit that includes a smooth peak current control (SPCC) circuit, so that the overcurrent protection circuit has low power consumption, the voltage and current are effectively limited when the current is overloaded, and the normal working voltage can be restored after the overload of the output terminal of the overcurrent protection circuit is released.

Figure 2:
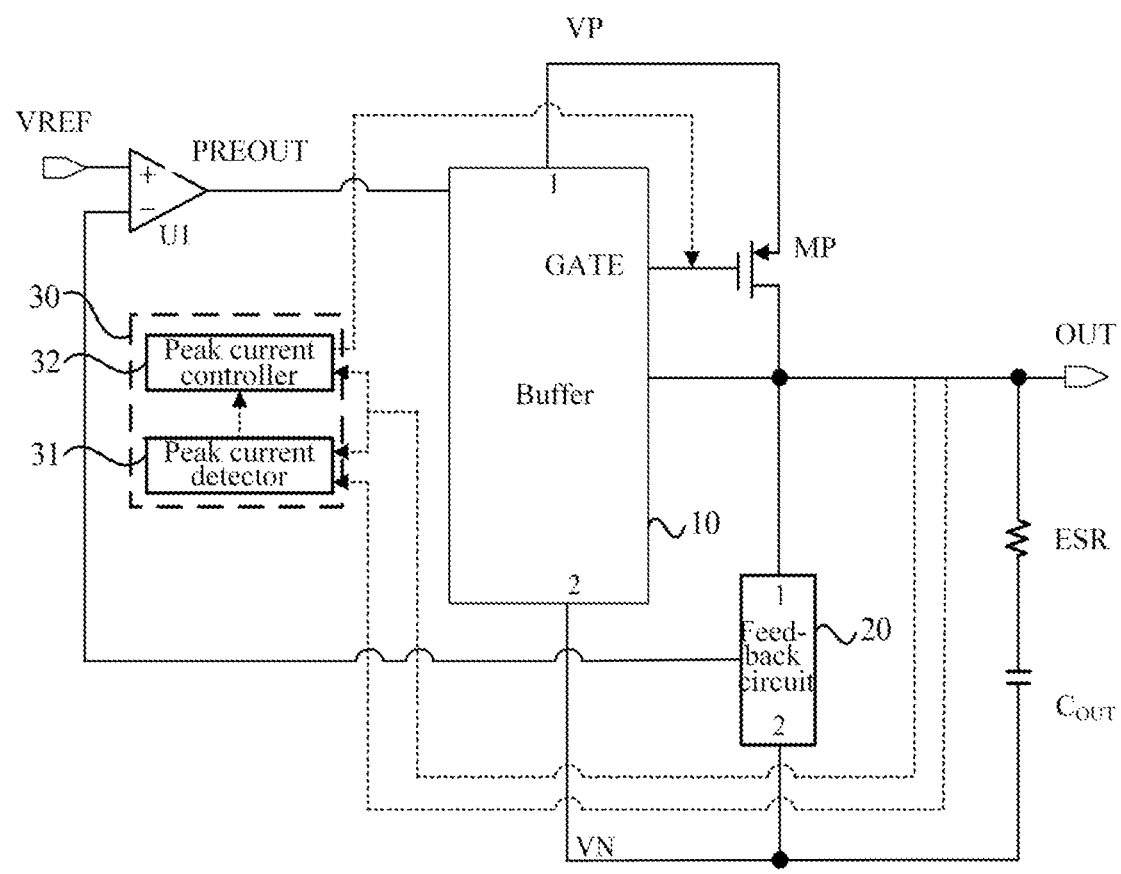
FIG. 2 is a circuit diagram of an overcurrent protection circuit according to an embodiment of the present disclosure.

FIG. 2 is a circuit diagram of an overcurrent protection circuit according to an embodiment of the present disclosure. With reference to FIG. 2, the overcurrent protection circuit includes an operational amplifier U1, a buffer 10, a drive transistor MP, a feedback circuit 20, and an SPCC circuit 30. The gate of the drive transistor MP is electrically connected with the gate control terminal GATE of the buffer 10, the first electrode of the drive transistor MP is electrically connected with a first power terminal VP, and the second electrode of the drive transistor MP is electrically connected with the first terminal of the feedback circuit 20 and the output terminal OUT of the overcurrent protection circuit. The second terminal 2 of the feedback circuit 20 is electrically connected with a second power terminal VN, and the feedback circuit 20 is used for converting the current of a branch where the drive transistor MP is located into a voltage and then feeding the voltage back to the inverting input terminal of the operational amplifier U1. The branch where the drive transistor MP is located includes the drive transistor MP and the feedback circuit 20. The current flow direction of the branch where the drive transistor MP is located may include: the current flows from the first power terminal VP to the first electrode of the drive transistor MP, after passing through the drive transistor MP, flows from the second electrode of the drive transistor MP to the first terminal 1 of the feedback circuit 20, and after passing through the feedback circuit 20, flows from the second terminal 2 of the feedback circuit 20 to the second power terminal VN.

The first terminal 1 of the buffer 10 is electrically connected with the first power terminal VP, the second terminal 2 of the buffer 10 is electrically connected with the second power terminal VN, the input terminal of the buffer 10 is electrically connected with the output terminal PREOUT of the operational amplifier U1, the output terminal of the buffer 10 is electrically connected with the output terminal OUT of the overcurrent protection circuit, and the operational amplifier U1 controls the drive transistor MP through the buffer 10. The output terminal OUT of the overcurrent protection circuit is the dominant pole, and the output terminal PREOUT of the operational amplifier U1 is the secondary dominant pole. The setting of the buffer 10 provides a phase margin to push the secondary dominant pole to a higher frequency position, that is, the overcurrent protection circuit has enough phase margin in the frequency domain, so that the output current of the output terminal OUT of the overcurrent protection circuit is more stable.

The non-inverting input terminal of the operational amplifier U1 is electrically connected with the reference voltage terminal VREF, the inverting input terminal of the operational amplifier U1 is electrically connected with the output terminal of the feedback circuit 20, and the operational amplifier U1 controls the magnitude of the voltage of the output terminal PREOUT of the operational amplifier U1 according to the voltage signal fed back by the feedback circuit 20. In the normal working state, the voltage of the reference voltage terminal VREF and the voltage fed back by the feedback circuit 20 pass through the operational amplifier U1, and after the difference between the two voltages is amplified and adjusted, the two voltages are outputted to the buffer 10 through the output terminal PREOUT of the operational amplifier U1. A negative feedback voltage loop composed of the operational amplifier U1, the buffer 10, the drive transistor MP and the feedback circuit 20 is the main loop.

The SPCC circuit 30 includes a peak current detector (PCD) and a peak current controller (PCC) 32. The peak current detector 31 is used for detecting the current of the output terminal OUT of the overcurrent protection circuit and when the current of the output terminal OUT of the overcurrent protection circuit is overloaded (because the output terminal OUT of the overcurrent protection circuit is electrically connected with the load for driving the load, when the current of the load is overloaded, the current of the output terminal OUT of the overcurrent protection circuit is overloaded), the peak current detector 31 controls the peak current controller 32 to control the gate of the drive transistor MP, clamps the potential of the gate of the drive transistor MP within a preset voltage range and controls the output terminal OUT of the overcurrent protection circuit to stably output to maintain the overcurrent protection circuit to work.

An embodiment of the present disclosure provides an overcurrent protection circuit that includes an SPCC circuit 30, where the SPCC circuit 30 includes a peak current detector and a peak current controller 32.

The peak current detector 31 is used for detecting the current of the output terminal OUT of the overcurrent protection circuit, and when the current of the output terminal OUT of the overcurrent protection circuit is overloaded, controlling the peak current controller 32 to control the gate of the drive transistor MP and clamping the potential of the gate of the drive transistor MP within a preset voltage range. When the main loop controlled by the operational amplifier U1 is turned off, the peak current controller 32 and the drive transistor MP can still control the output terminal OUT of the overcurrent protection circuit to output stably, and the current of the output terminal OUT of the overcurrent protection circuit is limited within an expected current range. When the overload current disappears, the peak current detector 31 detects that the current of the output terminal OUT of the overcurrent protection circuit drops, controls the peak current controller 32 to stop controlling the drive transistor MP, returns the driving initiative of the overcurrent protection circuit to the main loop controlled by the operational amplifier U1 and restores the voltage of the output terminal OUT of the overcurrent protection circuit to a set voltage. The overcurrent protection circuit provided by the embodiment of the present disclosure enables the overcurrent protection circuit to have low power consumption, the voltage and current to be effectively limited when the current is overloaded, and the normal working voltage to be restored after the overload of the output terminal OUT of the overcurrent protection circuit is released.

Figure 3:
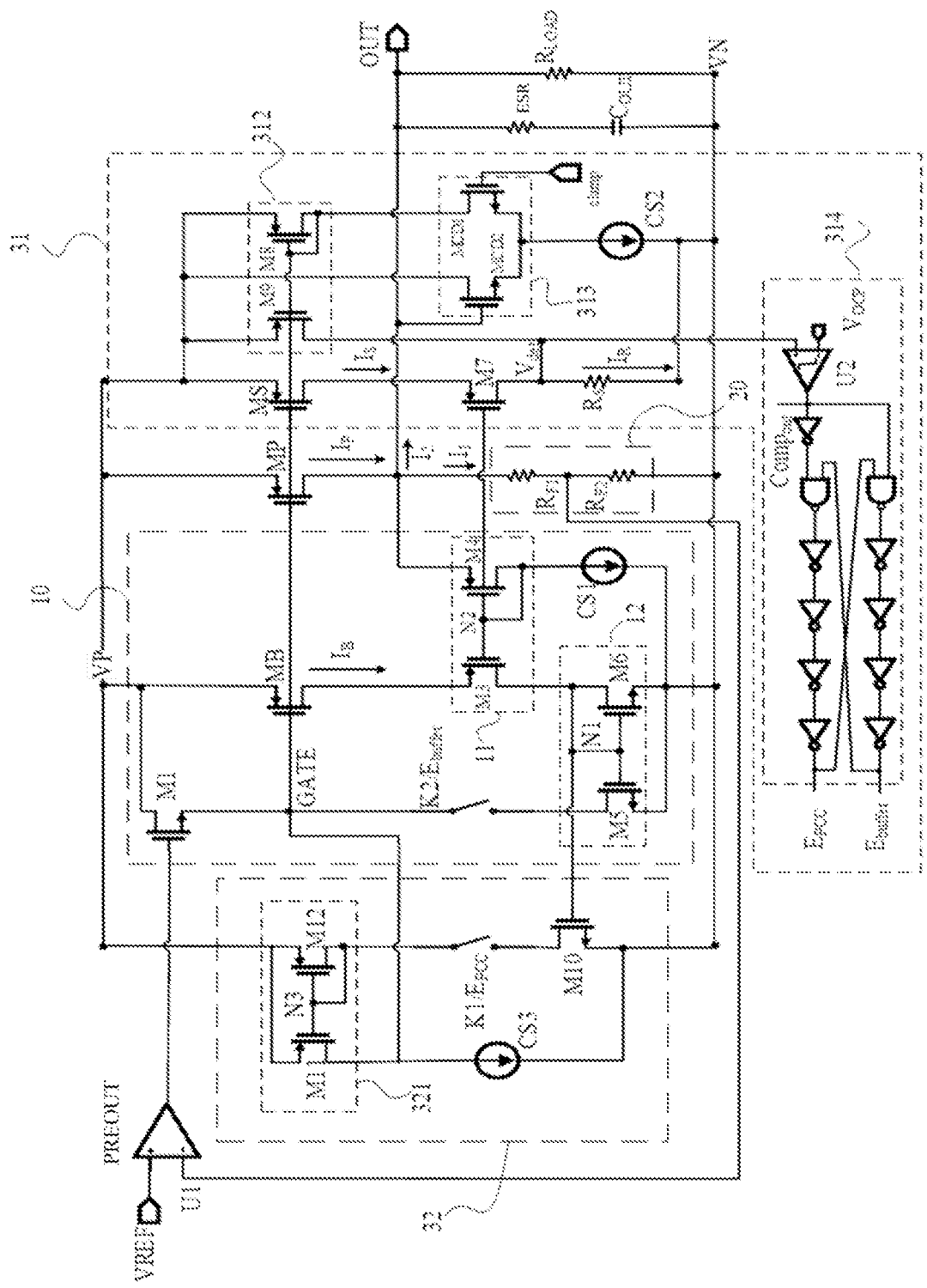
FIG. 3 is a circuit diagram of another overcurrent protection circuit according to an embodiment of the present disclosure.

FIG. 3 is a circuit diagram of another overcurrent protection circuit according to an embodiment of the present disclosure. With reference to FIGS. 2 and 3, a first switch K1 is provided within the peak current controller 32, and a second switch K2 is provided within the buffer 10. The peak current detector 31 controls the peak current controller 32 to control the gate of the drive transistor MP by controlling the first switch K1 to be turned on and controls the peak current controller 32 to stop controlling the gate of the drive transistor MP by controlling the first switch K1 to be turned off. The peak current detector 31 further controls the operational amplifier U1 to control the gate of the drive transistor MP by controlling the second switch K2 to be turned on and controls the operational amplifier U1 to stop controlling the gate of the drive transistor MP by controlling the second switch k2 to be turned off.

As shown in FIG. 3, the peak current detector 31 includes a hysteresis comparison circuit 314 which includes a first signal output terminal $E_{pcc}$ and a second signal output terminal $E_{buffer}$, the first switch K1 includes a control terminal, the control terminal of the first switch K1 is connected with the first signal output terminal $E_{pcc}$ of the hysteresis comparison circuit 314, and the first signal output terminal $E_{pcc}$ is used for outputting a first signal to control the first switch K1 to be turned on or off. The second switch K2 includes a control terminal, the control terminal of the second switch K2 is connected with the second signal output terminal $E_{buffer}$ of the hysteresis comparison circuit 314, and the second signal output terminal $E_{buffer}$ is used for outputting a second signal to control the second switch K2 to be turned on or off.

The peak current detector 31 further includes a first replication transistor MS, an overload feedback circuit, a detection circuit Rs, and a hysteresis comparison circuit 314, where the overload feedback circuit includes a third current mirror circuit 312 and a comparison input circuit 313. The first replication transistor MS is used for providing a first induced current, where the first induced current proportionally replicates the current of the drive transistor MP. The overload feedback circuit is used for providing a feedback current. The detection circuit Rs is used for providing a detection voltage according to the first induced current and the feedback current and transmitting the detection voltage to the hysteresis comparison circuit 314. The hysteresis comparison circuit 314 controls the first signal output terminal $E_{pcc}$ to output the first signal and the second signal output terminal $E_{buffer}$ to output the second signal according to the detection voltage.

With reference to FIGS. 2 and 3, the gate of the first replication transistor MS is electrically connected with the gate control terminal GATE, the first electrode of the first replication transistor MS is electrically connected with the first power terminal VP, and the second electrode of the first replication transistor MS is connected with the detection circuit Rs.

The first replication transistor MS is used for providing a first induced current $I_S$, where the magnitude of the first induced current $I_S$ is proportional to the magnitude of the current of the drive transistor MP, so as to detect the current of the output terminal OUT of the overcurrent protection circuit. For example, if the width-to-length ratio of the drive transistor MP is K times the width-to-length ratio of the first replication transistor MS, and then the current replicated by the first replication transistor MS is 1/K of the current flowing through the drive transistor MP, that is, $I_S=I_P/K$, where $I_S$ is the first induced current of the first replication transistor MS and $I_P$ is the current flowing through the drive transistor MP. The current replicated by the first replication transistor MS is set to be 1/K of the current flowing through the drive transistor MP, as long as the first replication transistor MS senses the change of the current of the drive transistor MP, and the current as large as the current of the drive transistor MP is not required, thereby reducing the power consumption of the circuit.

The overload feedback circuit includes a comparison input circuit 313 and a third current mirror circuit 312 and is used for providing a feedback current. The comparison input circuit 313 includes a first comparison transistor MCD1 and a second comparison transistor MCD2. The gate of the first comparison transistor MCD1 is electrically connected with a clamp voltage terminal clamp, the gate of the second comparison transistor MCD2 is connected with the output terminal OUT of the overcurrent protection circuit, the second electrode of the first comparison transistor MCD1 and the second electrode of the second comparison transistor MCD2 are both electrically connected with the second power terminal VN, the first electrode of the second comparison transistor MCD2 is electrically connected with the first power terminal VP, and the first electrode of the first comparison transistor MCD1 is electrically connected with the third current mirror circuit 312. The third current mirror circuit 312 includes an eighth transistor M8 and a ninth transistor M9. The gate of the eighth transistor M8 is electrically connected with the gate of the ninth transistor M9, the first electrode of the eighth transistor M8 and the first electrode of the ninth transistor M9 are both electrically connected with the first power terminal VP, the second electrode of the eighth transistor M8 is electrically connected with the first electrode of the first comparison transistor MCD1, and the gate of the eighth transistor M8 is electrically connected with the second electrode of the eighth transistor M8. The second electrode of the ninth transistor M9 is electrically connected with the first terminal of the detection circuit Rs.

The comparison input circuit 313 is used for turning on the third current mirror circuit 312 when the voltage $V_{clamp}$ of the clamp voltage terminal clamp is greater than or equal to the voltage $V_{OUT}$ of the output terminal OUT of the overcurrent protection circuit, and turning off the third current mirror circuit 312 when the voltage $V_{clamp}$ of the clamp voltage terminal clamp is less than the voltage $V_{OUT}$ of the output terminal OUT of the overcurrent protection circuit. Specifically, the first comparison transistor MCD1 and the second comparison transistor MCD2 constitute a differential pair. When $V_{clamp} \geq V_{OUT}$, the first comparison transistor MCD1 is turned on, the branches where the eighth transistor M8 and the first comparison transistor MCD1 are located are turned on, and the third current mirror circuit 312 is turned on. When $V_{clamp} < V_{OUT}$, the first comparator MCD1 is turned off, and the third current mirror circuit 312 is controlled to be turned off.

The third current mirror circuit 312 is connected with the detection circuit Rs, provides a feedback current $I_{clamp}$ to the detection circuit Rs when the third current mirror circuit 312 is turned on, and provides no feedback current $I_{clamp}$ to the detection circuit Rs when the third current mirror circuit 312 is turned off.

The first replication transistor MS and the third current mirror circuit 312 are both connected with the detection circuit Rs. When $V_{clamp} < V_{OUT}$, the comparison input circuit 313 controls the third current mirror circuit 312 to be turned off, and the current flowing to the detection circuit Rs is just the induced current Is flowing through the first replication transistor MS. When $V_{clamp} \geq V_{OUT}$, the comparison input circuit 313 controls the third current mirror circuit 312 to be turned on, and the current flowing to the detection circuit Rs includes the induced current Is flowing through the first replication transistor MS and the feedback current $I_{clamp}$ provided by the third current mirror circuit 312.

The detection circuit Rs provides a detection voltage $V_{det}$ according to the received induced current Is or both the induced current Is and the feedback current $I_{clamp}$, and transmits the detection voltage $V_{det}$ to the hysteresis comparison circuit 314.

As shown in FIG. 3, the hysteresis comparison circuit 314 is electrically connected with the second terminal of the detection circuit Rs, and the hysteresis comparison circuit 314 controls the first signal output terminal $E_{PCC}$ to output the first signal and the second signal output terminal $E_{buffer}$ to output the second signal according to the detection voltage $V_{det}$. For example, when the detection voltage $V_{det}$ is higher than the reference voltage $V_{ocp}$ of the hysteresis comparison circuit 314, the first signal outputted from the first signal output terminal $E_{PCC}$ changes from a low level to a high level, and the second signal outputted from the second signal output terminal $E_{buffer}$ changes from a high level to a low level.

In this embodiment, the detection circuit Rs includes a detection resistor Rs, and the detection resistor Rs is configured to convert a current flowing through the detection resistor Rs into a detection voltage $V_{det}$.

Optionally, the peak current detector 31 further includes a seventh transistor M7. The second electrode of the first replication transistor MS is electrically connected with the first electrode of the seventh transistor M7. The second electrode of the seventh transistor M7 is electrically connected with the first terminal of the detection circuit Rs. If the first replication transistor MS is directly connected with the first terminal of the detection circuit Rs, the Vsd of the first replication transistor MS is large (the Vsd of the first replication transistor MS refers to the source-drain voltage difference of the first replication transistor MS), the current replicated by the first replication transistor MS from the drive transistor MP is prone to deviation, and generally, the current replicated by the first replication transistor MS from the drive transistor MP is prone to be too large. Therefore, the seventh transistor M7 is connected in series between the first replication transistor MS and the first terminal of the detection circuit Rs for improving the accuracy of the current replicated by the first replication transistor MS.

Optionally, with reference to FIGS. 2 and 3, the peak current detector 31 further includes a second current source CS2, where the second electrode of the first comparator transistor MCD1 and the second electrode of the second comparator transistor MCD2 are connected with the second power terminal VN through the second current source CS2. Regardless of the voltage across the second current source CS2, the second current source CS2 can always provide a fixed current for the outside.

With continued reference to FIGS. 2 and 3, the peak current controller 32 includes a first switch K1, a second connection transistor M10, and a fourth current mirror circuit 321. The first electrode of the second connection transistor M10 is connected with the second terminal of the first switch K1, and the second electrode of the second connection transistor M10 is connected with the second power terminal VN. The first terminal of the first switch K1 is connected with the fourth current mirror circuit 321, and the fourth current mirror circuit 321 is also connected with the gate control terminal GATE.

The control terminal of the first switch K1 is connected with a first signal output terminal $E_{PCC}$. When the first signal outputted from the first signal output terminal $E_{PCC}$ controls the first switch K1 to be turned on, a path is formed at the branches where the first switch K1 and the second connection transistor M10 are located, and the fourth current mirror circuit 321 provides a stable current for the gate control terminal GATE and controls the drive transistor MP to work normally to maintain the overcurrent protection circuit to work. When the first signal outputted from the first signal output terminal $E_{PCC}$ controls the first switch K1 to be turned off, the path at the branch where the first switch K1 and the second connection transistor M10 are located is disconnected, the fourth current mirror circuit 321 is turned off, the peak current controller 32 is turned off, and the peak current controller 32 no longer controls the overcurrent protection circuit to work.

The fourth current mirror circuit 321 includes an eleventh transistor M11 and a twelfth transistor M12 whose gates are connected with each other. The first electrode of the eleventh transistor M11 and the first electrode of the twelfth transistor M12 are connected with the first power terminal VP, and the second electrode of the eleventh transistor M11 is connected with the gate control terminal GATE. The second electrode of the twelfth transistor M12 is connected with the gate of the twelfth transistor M12 and the first terminal of the first switch K1.

Optionally, the peak current controller 32 further includes a third current source CS3 through which the fourth current mirror circuit 321 is electrically connected with the second power terminal VN. Regardless of the voltage across the third current source CS3, the third current source CS3 can always provide a fixed current for the outside.

With reference to FIGS. 2 and 3, the buffer 10 includes a second switch K2, a first connection transistor M1, a second replication transistor MB, and a stable current circuit, where the stable current circuit includes a first current mirror circuit 11, a second current mirror circuit 12, and a first current source CS1.

The gate of the first connection transistor M1 is connected with the output terminal PREOUT of the operational amplifier U1, the first electrode of the first connection transistor M1 is electrically connected with the first power terminal VP, and the second electrode of the first connection transistor M1 is connected with the gate control terminal GATE.

The first terminal of the second switch K2 is connected with the gate control terminal GATE, and the second terminal of the second switch K2 is connected with the stable current circuit. The gate of the second replication transistor MB is connected with the gate control terminal GATE, the first electrode of the second replication transistor MB is connected with the first electrode of the first connection transistor M1, and the second electrode of the second replication transistor MB is connected with the stable current circuit.

The second switch K2 of the buffer 10 is controlled by a second signal output terminal $E_{buffer}$ of the peak current detector 31. When the current output by the output terminal OUT of the overcurrent protection circuit is not overload, the second signal output terminal $E_{buffer}$ controls the second switch K2 to be turned on, and the second switch K2 is connected with the stable current circuit and the first connection transistor M1 to provide a stable current for the first connection transistor M1. Meanwhile, the operational amplifier U1 also controls the first connection transistor M1 to be turned on, and the main loop where the operational amplifier U1 is located controls the overcurrent protection circuit to work. When the current output by the output terminal OUT of the overcurrent protection circuit is overload, the second signal output terminal $E_{buffer}$ controls the second switch K2 to be turned off.

With reference to FIGS. 2 and 3, the overcurrent protection circuit further includes a feedback circuit 20. The first terminal of the feedback circuit 20 is connected with the second electrode of the drive transistor MP, and the second terminal 2 of the feedback circuit 20 is connected with the inverting input terminal of the operational amplifier U1. The feedback circuit 20 is used for feeding back a change of a feedback voltage caused by a change of a current flowing through the drive transistor MP to the inverting input terminal of the operational amplifier U1, the operational amplifier U1 changes the voltage of the output terminal PREOUT according to the change of the feedback voltage.

The current $I_p$ flowing through the drive transistor MP is divided into two branch currents, that is, a first current $I_1$ and a second current $I_2$. The second current $I_2$ is an output stage current flowing to the output terminal OUT of the overcurrent protection circuit, and the first current $I_1$ is used for flowing to the feedback circuit 20.

When the first current $I_1$ decreases, the current flowing through the feedback circuit 20 decreases, the voltage fed back by the feedback circuit 20 to the inverting input terminal of the operational amplifier U1 decreases, and the voltage of the gate of the first connection transistor M1 is also driven to decrease. Meanwhile, the second signal output terminal $E_{buffer}$ controls the second switch K2 to be turned off, the second switch K2 no longer provides a stable current to the second electrode (source) of the first connection transistor M1, and the capability of the stable current circuit to stably pull down the second electrode of the first connection transistor M1 is turned off. Further, meanwhile, the first switch K1 is turned on, the peak current controller 32 provides a stable high voltage to the gate control terminal GATE that is also the source of the first connection transistor M1 so that the source voltage of the first connection transistor M1 is higher than the gate voltage of the first connection transistor M1, resulting in the first connection transistor M1 being turned off, and the main loop controlled by the operational amplifier U1 is turned off and no longer controls the voltage of the gate control terminal GATE.

When the first current $I_1$ increases, the current flowing through the feedback circuit 20 increases, the voltage fed back by the feedback circuit 20 to the inverting input terminal of the operational amplifier U1 increases, and the output terminal PREOUT of the operational amplifier U1 outputs a low level signal to the gate of the first connection transistor M1, so that the gate voltage of the first connection transistor M1 increases. Meanwhile, the first signal output terminal $E_{pcc}$ controls the first switch K1 to be turned off, and the second signal output terminal $E_{buffer}$ controls the second switch K2 to be turned on; the first switch K1 is turned off, and the peak current controller 32 no longer controls the voltage of the gate control terminal GATE; the second switch K2 is turned on, the second switch K2 is connected with the second electrode (source) of the first connection transistor M1 and the stable current circuit, the stable current circuit pulls down the voltage of the gate control terminal GATE that is also the source of the first connection transistor M1, the first connection transistor M1 is turned on, the main loop controlled by the operational amplifier U1 is turned on and controls the voltage of the gate control terminal GATE, the overcurrent protection circuit works normally, and the output terminal OUT of the overcurrent protection circuit outputs the set voltage.

The stable current circuit includes a first current mirror circuit 11, a second current mirror circuit 12, and a first current source CS1. The first current mirror circuit 11 includes a third transistor M3 and a fourth transistor M4 whose gates are connected with each other, and the second current mirror circuit 12 includes a fifth transistor M5 and a sixth transistor M6 whose gates are connected with each other. The first electrode of the third transistor M3 is connected with the second electrode of the second replication transistor MB, the second electrode of the third transistor M3 is connected with the first electrode of the sixth transistor M6, and the gate of the third transistor M3 and the gate of the fourth transistor M4 are connected at a second node N2. The gate of the fourth transistor M4 is connected with a second electrode of the fourth transistor M4, the first electrode of the fourth transistor M4 is electrically connected with the output terminal OUT of the overcurrent protection circuit, the second electrode of the fourth transistor M4 is connected with the first terminal of the first current source CS1, and the second terminal of the first current source CS1 is electrically connected with the second power terminal VN. Regardless of the voltage across the first current source CS1, the first current source CS1 can always provide a fixed current for the outside. The first electrode of the fifth transistor M5 in the second current mirror circuit 12 is connected with the second terminal of the second switch K2, the second electrode of the fifth transistor M5 is electrically connected to the second power terminal VN, and the gate of the fifth transistor M5 and the gate of the sixth transistor are connected at a first node N1. The first electrode of the sixth transistor M6 is also connected with the gate of the sixth transistor M6 at the first node N1, and the second electrode of the sixth transistor M6 is electrically connected with the second power terminal VN. The third transistor M3 replicates the current of the fourth transistor M4 and provides the replicated current for the sixth transistor M6, and the fifth transistor M5 replicates the current of the sixth transistor M6 and provides the replicated current for the second terminal of the second switch K2.

The gate of the second replication transistor MB is connected with the gate control terminal GATE, the first electrode of the second replication transistor MB is connected with the first power terminal VP, and the second electrode of the second replication transistor MB is connected with the third transistor M3 in the first current mirror circuit 11. The second replication transistor MB is used for replicating the current of the drive transistor MP. For example, if the width-to-length ratio of the drive transistor MP is K times the width-to-length ratio of the second replication transistor MB, and then the current replicated by the second replication transistor MB is 1/K of the current flowing through the drive transistor MP, that is, $$I_B = \frac{1}{K}I_P,$$

where $I_B$ is the current replicated by the second replication transistor MB and $I_P$ is the current flowing through the drive transistor MP. The first current mirror circuit 11 is used for limiting the current of the second replication transistor MB when entering the linear region and preventing the current of the second replication transistor MB from being too large. That is, the second replication transistor MB enters the linear region and then works in the saturation region, and when second replication transistor MB enters the linear region, the first current mirror circuit 11 is used for limiting the current of the second replication transistor MB. It is to be noted that no matter whether the second switch K2 is turned on or off, the second replication transistor MB works normally, and the buffer 10 is in a working state, so that the output current of the output terminal OUT of the overcurrent protection circuit can be stabilized.

In the overcurrent protection circuit provided by the present disclosure, when the current of the output terminal OUT of the overcurrent protection circuit is overloaded, the peak current controller 32 is started, the main loop controlled by the operational amplifier U1 is turned off, and the peak current controller 32 controls the voltage of the gate control terminal GATE and further controls the voltage of the gate of the drive transistor MP. Meanwhile, the voltage provided by the peak current controller 32 is high, which is not sufficient to maintain the voltage of the output terminal OUT of the overcurrent protection circuit to be stable in the case of current overload, and the output terminal OUT of the overcurrent protection circuit will drop until the voltage of the output terminal OUT of the overcurrent protection circuit is less than the voltage of the clamp voltage terminal clamp. Therefore, the current of the output terminal OUT of the overcurrent protection circuit is limited in a controllable range and is not too high by reducing the voltage of the output terminal OUT of the overcurrent protection circuit.

Optionally, the gate of the seventh transistor M7 of the peak current detector 31 is electrically connected with the second node N2 of the buffer 10, and the second node N2 provides a bias voltage for the gate of the seventh transistor M7 to control the seventh transistor M7 to be turned on.

Optionally, the gate of the second connection transistor M10 of the peak current controller 32 is electrically connected with the first node N1, and the second electrode of the second connection transistor M10 is electrically connected with the second power terminal VN. The second connection transistor M10 and the sixth transistor M6 also constitute a current mirror circuit, and the second connection transistor M10 replicates the current flowing through the sixth transistor M6 and provides the replicated mirror current to the fourth current mirror circuit 321.

Figure 4:
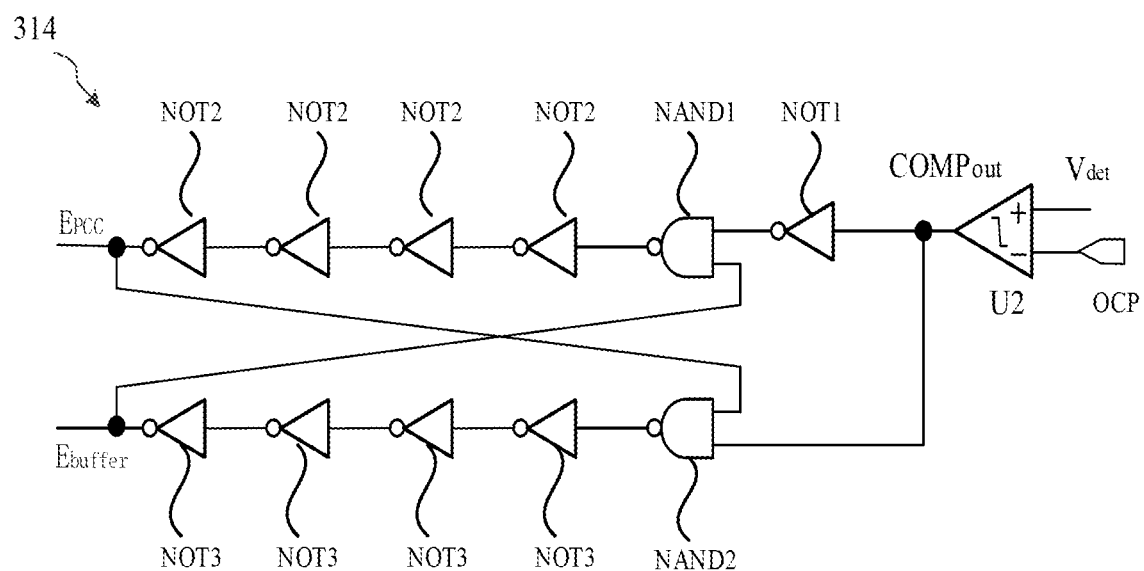
FIG. 4 is a circuit diagram of a hysteresis comparison circuit according to an embodiment of the present disclosure.

FIG. 4 is a circuit diagram of a hysteresis comparison circuit according to an embodiment of the present disclosure. With reference to FIGS. 3 and 4, the hysteresis comparison circuit 314 includes a comparator U2, a first NOT gate circuit NOT1, a first NAND gate circuit NAND1, a plurality of second NOT gate circuits NOT2, a second NAND gate circuit NAND2, and a plurality of third NOT gate circuits NOT3. The number of the second NOT gate circuits NOT2 is equal to the number of the third NOT gate circuits NOT3.

The non-inverting input terminal of the comparator U2 is electrically connected with the second terminal of the detection circuit Rs for inputting the detection voltage $V_{det}$. The inverting input terminal of the comparator U2 is electrically connected with the reference voltage terminal OCP for inputting the reference voltage $V_{OCP}$. The output terminal COMPout of the comparator U2 is electrically connected with the input terminal of the first NOT gate circuit NOT1. The output terminal of the first NOT gate circuit NOT1 is electrically connected with the first input terminal of the first NAND gate circuit NAND1. The second input terminal of the first NAND gate circuit NAND1 is electrically connected with the second signal output terminal $E_{buffer}$, the voltage signal outputted from the second signal output terminal $E_{buffer}$ is fed back to the second input terminal of the first NAND gate circuit NAND1, and the output terminal of the first NAND gate circuit NAND1 is electrically connected with the first signal output terminal $E_{PCC}$ through a plurality of the second NOT gate circuits NOT2 connected in series. The first input terminal of the second NAND gate circuit NAND2 is electrically connected with the first signal output terminal $E_{PCC}$, the voltage signal outputted from the first signal output terminal $E_{PCC}$ is fed back to the first input terminal of the second NAND gate circuit NAND2, the second input terminal of the second NAND gate circuit NAND2 is electrically connected to the output terminal COMPout of the comparator U2, and the output terminal of the second NAND gate circuit NAND2 is electrically connected with the second signal output terminal $E_{buffer}$ through a plurality of the third NOT gate circuits NOT3 connected in series.

For example, with reference to FIG. 4, the hysteresis comparison circuit 314 includes four second NOT gates NOT2 and four third NOT gates NOT3. The output terminal of the first NAND gate circuit NAND1 is electrically connected with the first signal output terminal $E_{PCC}$ through four second NAND gate circuits NOT2 connected in series. The output terminal of the second NAND gate circuit NAND2 is electrically connected with the second signal output terminal $E_{buffer}$ through four third NAND gate circuits NOT3 connected in series. When the voltage of the output terminal COMPout is high, the output terminal of the first NOT gat circuit NOT1 is at a low level, the first signal outputted from the first signal output terminal $E_{PCC}$ is at a high level, and the second signal outputted from the second signal output terminal $E_{buffer}$ is at a low level. The first input terminal of the first NAND gate circuit NAND1 is at a low level, the second input terminal of the first NAND gate circuit NAND1 is at a low level, the output terminal of the first NAND gate circuit NAND1 is at high level after the NAND operation of the first NAND gate circuit NAND1, the output terminal of the first one of the second NOT gate circuits NOT2 is at low level after the NOT operation of the first one of the second NAND gate circuits NOT2 adjacent to the first NAND gate circuit NAND1, the output terminal of the second one of the second NOT gate circuits NOT2 is at high level after the NOT operation of the second one of the second NOT gate circuits NOT2, the output terminal of the third one of the second NOT gate circuits NOT2 is at low level after the NOT operation of the third one of the second NOT gate circuits NOT2, and the first signal outputted from the first signal output terminal $E_{PCC}$ is at high level after the NOT operation of the fourth one of the second NOT gate circuits NOT2. Similarly, the first input terminal of the second NAND gate circuit NAND2 is at a high level, the second input terminal of the second NAND gate circuit NAND2 is at a high level, the output terminal of the second NAND gate circuit NAND2 is at a low level, the output terminal of the first one of the third NOT gate circuits NOT3 is at a high level, the output terminal of the second one of the third NOT gate circuits NOT3 is at low level, the output terminal of the third one of the third NOT gate circuits NOT3 is at a high level, and after the NOT operation of the fourth one of the third NOT gate circuits NOT3, the second signal outputted from the second signal output terminal $E_{buffer}$ is at a low level.

It is to be noted that since the hysteresis comparison circuit 314 includes the first NOT gate circuit NOT1, the second NOT gate circuit NOT2, the third NOT gate circuit NOT3 and the like, the signal will be delayed after passing through theses NOT gate circuits, which causes the first signal from the first signal output terminal $E_{PCC}$ and the second signal from the second signal output terminal $E_{buffer}$ to be delayed with respect to the signal from the output terminal COMPout. In this way, the level of the output terminal COMPout are inverted, and after a period of time, the levels of the first signal output terminal $E_{PCC}$ and the second signal output terminal $E_{buffer}$ are inverted. Such a design of delay inversion, in one aspect, prevents the abnormal on and off of the first switch K1 and the second switch K2 caused by the process of the level inversion of the output terminal COMPout, and in another aspect, prevents the abnormal on and off of the first switch K1 and the second switch K2 caused by jitter of the detection voltage $V_{det}$ in the vicinity of the reference voltage $V_{OCP}$. Therefore, the design of delay inversion improves the system stability of the overcurrent protection circuit.

With reference to FIGS. 2 and 3, the feedback circuit 20 includes a first feedback resistor $R_{F1}$ and a second feedback resistor $R_{F2}$ connected in series. The first terminal of the first feedback resistor $R_{F1}$ is connected with the second electrode of the drive transistor MP, the second terminal of the second feedback resistor $R_{F2}$ is electrically connected with the second power terminal VN, and the second terminal of the first feedback resistor $R_{F1}$ and the first terminal of the second feedback resistor $R_{F2}$ are electrically connected with the inverting input terminal of the operational amplifier U1. In an embodiment of the present disclosure, the resistor string formed by the first feedback resistor $R_{F1}$ and the second feedback resistor $R_{F2}$ is in the same branch as the drive transistor MP, and the current flowing through the drive transistor MP is converted into a voltage signal and then fed back to the inverting input terminal of the operational amplifier U1. When the voltage of the output terminal OUT of the overcurrent protection circuit decreases, the first current $I_1$ decreases, the current flowing through the first feedback resistor $R_{F1}$ decreases, the voltage fed back to the inverting input terminal of the operational amplifier U1 decreases, the output terminal PREOUT of the operational amplifier U1 outputs a high-level signal to control the first connection transistor M1 to be turned off, a path at the branch where the first connection transistor M1 and the second switch K2 are located is disconnected, and the main loop controlled by the operational amplifier U1 is disconnected. When the voltage of the output terminal OUT of the overcurrent protection circuit increases, the first current $I_1$ increases, the current flowing through the first feedback resistor $R_{F1}$ increases, the voltage fed back to the inverting input terminal of the operational amplifier U1 increases, the output terminal PREOUT of the operational amplifier U1 outputs a low-level signal to control the first connection transistor M1 to be turned on, a path is formed at the branch where the first connection transistor M1 and the second switch K2 are located, and the main loop controlled by the operational amplifier U1 controls the overcurrent protection circuit to work.

For example, with reference to FIGS. 2 and 3, the overcurrent protection circuit further includes a voltage stabilizing capacitor $C_{OUT}$. The first plate of the voltage stabilizing capacitor $C_{OUT}$ is electrically connected with the output terminal OUT of the overcurrent protection circuit, and the second plate of the voltage stabilizing capacitor $C_{OUT}$ is electrically connected with the second power terminal VN. The equivalent resistance of the voltage stabilizing capacitor $C_{OUT}$ is indicated by the resistance ESR.

Figure 5:
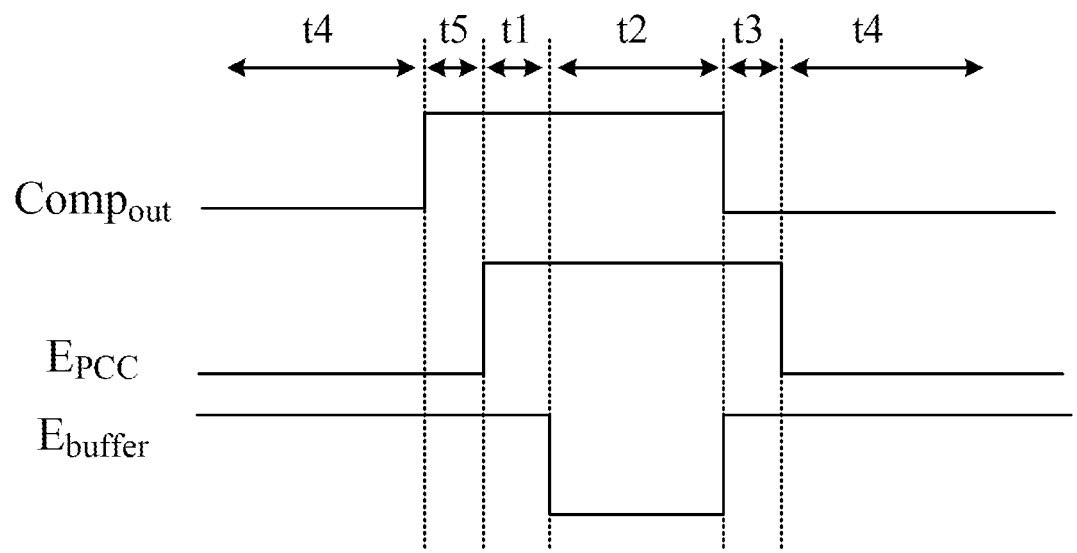
FIG. 5 is a timing diagram of an overcurrent protection circuit according to an embodiment of the present disclosure.

FIG. 5 is a timing diagram of an overcurrent protection circuit according to an embodiment of the present disclosure. The timing includes a first time period t1, a second time period t2, a third time period t3 and a fourth time period t4.

In the fourth time period t4, the overcurrent protection circuit is in a normal working state, and there is no overload current at the output terminal of the overcurrent protection circuit. In the peak current detector 31, the detection voltage $V_{det}$ transmitted from the detection circuit Rs is smaller than the reference voltage $V_{OCP}$ of the reference voltage terminal OCP connected with the inverting input terminal of the comparator U2, and the output terminal COMPout of the comparator U2 outputs a low-level signal. Meanwhile, the first signal outputted from the first signal output terminal $E_{PCC}$ is at a low level, the second signal outputted from the second signal output terminal $E_{buffer}$ is at high level, the current controller 32 is turned off, and the operational amplifier U1 controls the overcurrent protection circuit to work in a normal state.

When there is an overload current at the output of the overcurrent protection circuit, the overcurrent protection circuit enters the first time period t1. In the peak current detector 31, the detection voltage $V_{det}$ transmitted from the detection circuit Rs is larger than the reference voltage $V_{OCP}$ of the reference voltage terminal OCP connected with the inverting input terminal of the comparator U2, and the output terminal COMPout of the comparator U2 outputs a high-level signal. Meanwhile, the peak current detector 31 controls the first signal outputted from the first signal output terminal $E_{PCC}$ to become at a high level and controls the second signal outputted from the second signal output terminal $E_{buffer}$ to be unchanged, the peak current controller 32 is turned on, the main loop controlled by the operational amplifier U1 is disconnected, and the operational amplifier U1 and the peak current controller 32 simultaneously control the gate of the drive transistor MP to drive the overcurrent protection circuit to work.

In the second time period t2 after the first time period t1, the peak current detector 31 controls the second signal outputted from the second signal output terminal $E_{buffer}$ to become at a low level, the main loop controlled by the operational amplifier U1 is disconnected, the peak current controller 32 is turned on and controls the gate of the drive transistor MP to drive the overcurrent protection circuit to work.

When the overload current at the output of the overcurrent protection circuit disappear, the overcurrent protection circuit enters the third time period t3. The detection voltage $V_{det}$ transmitted from the detection circuit Rs is smaller than the reference voltage $V_{OCP}$ of the reference voltage terminal OCP connected with the inverting input terminal of the comparator U2, and the output terminal COMPout of the comparator U2 outputs a low-level signal. Meanwhile, the peak current detector 31 controls the second signal outputted from the second signal output terminal $E_{buffer}$ to become at a high level and controls the first signal outputted from the first signal output terminal $E_{PCC}$ to be unchanged, the main loop controlled by the operational amplifier U1 is connected, the peak current controller 32 is also not turned off, and the operational amplifier U1 and the peak current controller 32 simultaneously control the gate of the drive transistor MP to drive the overcurrent protection circuit to work.

Subsequently, the overcurrent protection circuit enters the fourth time period t4 of the normal working stage. The peak current detector 31 controls the first signal outputted from the first signal output terminal $E_{PCC}$ to become at a low level, the peak current controller 32 is turned off, and the operational amplifier U1 controls the gate of the drive transistor MP to drive the overcurrent protection circuit to work.

Preferably, in an embodiment of the present disclosure, upon detecting the presence of an overload current, that is, in the first time period t1, the peak current detector 31 controls the operational amplifier U1 and the peak current controller 32 to simultaneously control the gate of the drive transistor MP; and upon detecting the disappearance of an overload current, that is, in the third time period t3, the peak current detector 31 controls the operational amplifier U1 and the peak current controller 32 to simultaneously control the gate of the drive transistor MP. That is, the peak current detector 31 controls the second signal outputted from the second signal output terminal $E_{buffer}$ and the first signal outputted from the first signal output terminal $E_{PCC}$ not to hop simultaneously, and in other words, the second signal outputted from the second signal output terminal $E_{buffer}$ and the first signal outputted from the first signal output terminal $E_{PCC}$ are subjected to hop hysteresis, which prevents the second signal outputted from the second signal output terminal $E_{buffer}$ and the first signal outputted from the first signal output terminal $E_{PCC}$ from changing at the same time, so that the working state of the overcurrent protection circuit is stable.

Preferably, according to the change of the detection voltage $V_{det}$, when the comparator U2 changes the signal of the output terminal COMPout, the change of the first signal outputted from the first signal output terminal $E_{PCC}$ and the change of the second signal outputted from the second signal output terminal $E_{buffer}$ are later than the change of the signal of the output terminal COMPout of the comparator. With reference to FIG. 5, there is also a fifth time period t5 for hysteresis inversion between the fourth time period t4 in which the overcurrent protection circuit works normally and the first time period t1 in which the first signal outputted from the first signal output terminal $E_{PCC}$ is changed. After the change of the signal at the comparator output terminal COMPout, the fifth time period t5 is delayed before the first signal outputted from the first signal output terminal $E_{PCC}$ changes, which prevents the abnormal on and off of the first switch K1 and the second switch K2 caused by the process of the level inversion of the output terminal COMPout, and in another aspect, prevents the abnormal on and off of the first switch K1 and the second switch K2 caused by jitter of the detection voltage $V_{det}$ in the vicinity of the reference voltage $V_{OCP}$.

Figure 6:
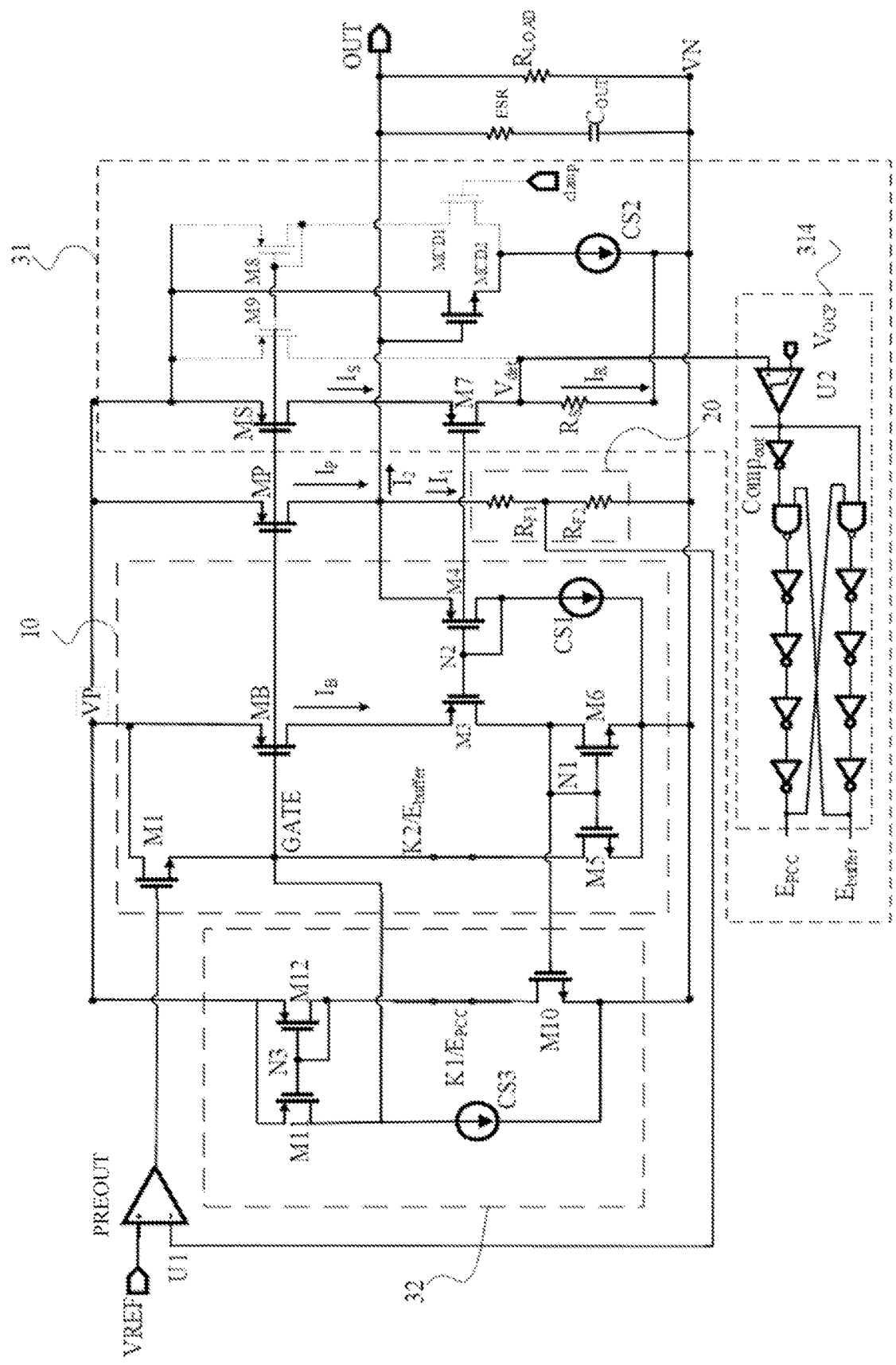
FIG. 6 is a circuit diagram of another overcurrent protection circuit according to an embodiment of the present disclosure.

With reference to FIGS. 5 to 9, where FIG. 6 to. 9 are schematic diagrams of the overcurrent protection circuit working in different time periods, in conjunction with the timing diagram in FIG. 5, the working conditions of each circuit are explained in detail.

FIG. 6 is a circuit diagram of another overcurrent protection circuit according to an embodiment of the present disclosure. FIG. 6 is a schematic diagram of the overcurrent protection circuit working during the first time period t1. With reference to FIGS. 5 and 6, when the current of the output terminal OUT of the overcurrent protection circuit is overloaded, the overcurrent protection circuit enters the first time period t1, the first signal generated by the first signal output terminal $E_{PCC}$ has changed from a low level to a high level, and the first signal at the high level controls the first switch K1 to be turned on to turn on the peak current controller 32. The second signal generated by the second signal output terminal $E_{buffer}$ keeps in a high level, and the second signal at the high level maintains the second switch K2 to be turned on, the output terminal PREOUT of the operational amplifier U1 and the gate of the drive transistor MP to be turned on and electrically connected, and the main loop controlled by the output terminal PREOUT of the operational amplifier U1 to be connected. In the embodiment of the present disclosure, when the current of the output terminal OUT of the overcurrent protection circuit is overloaded, the peak current controller 32 is started before the main loop controlled by the output terminal PREOUT of the operational amplifier U1 is disconnected, so that the peak current controller 32 and the operational amplifier U1 may jointly control the gate of the drive transistor MP, and the main loop controlled by the operational amplifier U1 and the peak current controller 32 may jointly control the output of the output terminal OUT of the overcurrent protection circuit. In this way, it is possible to prevent the phenomenon that the output floats when the main loop controlled by the operational amplifier U1 has been disconnected but the peak current controller 32 is not turned on.

For example, with reference to FIGS. 5 and 6, when the current at the output terminal OUT of the overcurrent protection circuit is suddenly overloaded or when the overload has just occurred, each circuit of the overcurrent protection circuit works as follows during the first time period t1.

In the first period t1, for the drive transistor MP, the current IP flowing through the drive transistor MP increases.

For the peak current detector 31, since the first replication transistor MS replicates the current of the drive transistor MP, the induced current $I_S$ increases, and the detection current $I_S$ received at the detection resistor Rs increases, and thus the detection voltage $V_{det}$ increases. When $V_{det} > V_{OCP}$, the signal outputted from the output terminal COMPout of the comparator U2 in the hysteresis comparison circuit 314 of the peak current detector 31 has been inverted from a low level to a high level. The hysteresis comparison circuit 314 also controls the change of the second signal generated by the second signal output terminal $E_{buffer}$ to be later than the change of the first signal generated by the first signal output terminal $E_{PCC}$, the second signal and the first signal are both at the high level and control both the second switch K2 and the first switch K1 to be turned on to maintain the normal working of the overcurrent protection circuit, and voltage of the output terminal OUT of the overcurrent protection circuit does not drop.

For the feedback circuit 20, since the voltage of the output terminal OUT of the overcurrent protection circuit does not drop, the first current $I_1$ remains unchanged, and the voltage at the inverting input terminal of the operational amplifier U1 is still greater than the voltage at the reference voltage terminal VREF. At this point, the output terminal PREOUT of the operational amplifier U1 still outputs a low-level signal and controls the first connection transistor M1 to remain on, the output terminal PREOUT of the operational amplifier U1 controls the voltage of the control gate control terminal GATE connected to the second electrode of the connection transistor M1 through the connection transistor M1.

In the buffer 10, since the second signal generated by the second signal output terminal $E_{buffer}$ is still at the high level, the second switch K2 remains on, and the branch where the first connection transistor M1, the second switch K2 and the fifth transistor M5 are located is connected.

In the peak current controller 32, when the first signal outputted from the first signal output terminal $E_{PCC}$ changes from a low level to a high level, the first switch K1 is turned on. The branch where the first switch K1, the second connection transistor M10 and the twelfth transistor M12 are located is connected. Since the eleventh transistor M11 and the twelfth transistor M12 constitute a current mirror, when the twelfth transistor M12 is turned on, the eleventh transistor M11 is also turned on. The first current source CS1 provides a current for the fourth transistor M4, the current of the fourth transistor M4 is replicated through the third transistor M3, and the sixth transistor M6 and the third transistor M3 are on the same branch and have the same current. The current of the sixth transistor M6 is replicated through the second connection transistor M10. The second connection transistor M10 and the twelfth transistor M12 are on the same branch and have the same current. The current of the second transistor M12 is replicated through the eleventh transistor M11. The third current source CS3 is used as a load current source, and the voltage of the gate control terminal GATE is controlled by the second electrode of the eleventh transistor M11.

In short, the output voltage of the first signal output terminal $E_{PCC}$ and the output voltage of the second signal output terminal $E_{buffer}$ are at the high level at the same time, and the main loop controlled by the operational amplifier U1 and the peak current controller 32 work at the same time. At this point, although there is abnormal overload current at the output terminal OUT of the overcurrent protection circuit, the overcurrent protection circuit can still output stably and the output voltage remains unchanged. The voltage of the output terminal OUT of the overcurrent protection circuit is greater than the voltage of the clamp voltage terminal clamp, the second comparator MCD2 is turned on, the first comparator MCD1 is turned off, the eighth transistor M8 and the branch where the first comparator MCD1 is located are turned off, the eighth transistor M8 is turned off, and the ninth transistor M9 is turned off because the ninth transistor M9 replicates the current of the eighth transistor M8.

Figure 7:
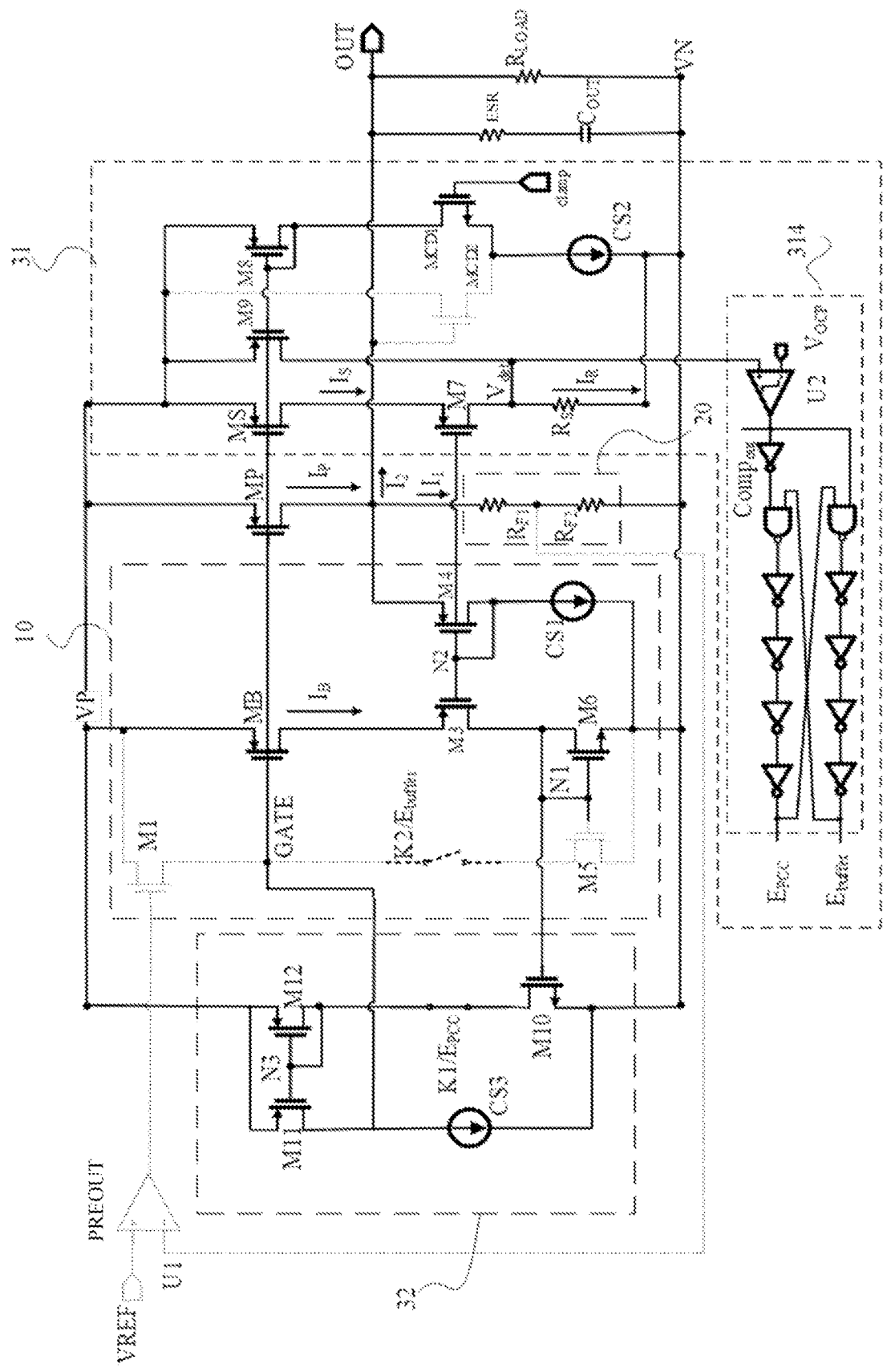
FIG. 7 is a circuit diagram of another overcurrent protection circuit according to an embodiment of the present disclosure.

FIG. 7 is a circuit diagram of the overcurrent protection circuit working in the second time period t2 according to an embodiment of the present disclosure. With reference to FIGS. 5 and 7, in the second time period t2, the current of the output terminal OUT of the overcurrent protection circuit remains overloaded, and the first signal generated by the first signal output terminal $E_{PCC}$ keeps the peak current controller 32 on. The second signal generated by the second signal output terminal $E_{buffer}$ disconnects the main loop controlled by the output terminal PREOUT of the operational amplifier U1.

For example, with reference to FIGS. 5 and 7, in the second time period t2, the first signal generated by the first signal output terminal $E_{PCC}$ is maintained at the changed high level, and the hysteresis comparison circuit 314 also controls the second signal generated by the second signal output terminal $E_{buffer}$ to change from a high level to a low level.

In a second time period t2, the second signal generated by the second signal output terminal $E_{buffer}$ controls the second switch K2 to be turned off, and the peak current controller 32 controls the gate of the drive transistor MP. However, since the peak current controller 32 has poor driving capability, the voltage of the output terminal OUT of the overcurrent protection circuit decreases, the first current $I_1$ decreases, the current flowing through the first feedback resistor $R_{F1}$ decreases, the voltage at the first terminal of the second feedback resistor $R_{F2}$ decreases, the voltage fed back to the inverting input terminal of the operational amplifier U1 decreases, the voltage at the inverting input terminal of the operational amplifier U1 is less than the voltage at the reference voltage terminal VREF, the voltage output from the output terminal PREOUT of the operational amplifier U1 to the gate of the first connection transistor M1 decreases. Meanwhile, the second switch K2 is turned off, the output terminal PREOUT of the operational amplifier U1 and the second switch K2 simultaneously control the first connection transistor M1 to be turned off, and the main loop controlled by the output terminal PREOUT of the operational amplifier U1 is disconnected.

The first signal generated by the first signal output terminal $E_{PCC}$ is maintained at a high level, and the first switch K1 is turned on. When the first switch K1 is turned on, the branch where the first switch K1, the second connection transistor M10 and the twelfth transistor M12 are located is connected. Since the eleventh transistor M11 and the twelfth transistor M12 constitute a current mirror, when the twelfth transistor M12 is turned on, the eleventh transistor M11 is also turned on. At this point, the voltage of the gate control terminal GATE is controlled by the second electrode of the eleventh transistor M11.

The second electrode of the eleventh transistor M11 controls the gate control terminal GATE to reach a high voltage value to weaken the capability of the drive transistor MP, the current provided by the drive transistor MP decreases and becomes insufficient to keep the voltage of the output terminal OUT of the overcurrent protection circuit stable and unchanged in the case of current overload, and the voltage of the output terminal OUT of the overcurrent protection circuit drops, so that the power consumption of the whole overcurrent protection circuit will not be too high.

When the voltage of the output terminal OUT of the overcurrent protection circuit drops to less than the voltage of the clamp voltage terminal clamp, that is, when $V_{OUT} < V_{clamp}$, the first comparison transistor MCD1 is turned on and the second comparison transistor MCD2 is turned off. Since the first comparison transistor MCD1 is turned on, the branch where the eighth transistor M8 and the first comparison transistor MCD1 are located is connected. Since the eighth transistor M8 and the ninth transistor M9 constitute a current mirror, when the eighth transistor M8 is turned on, the ninth transistor M9 is also turned on. When the ninth transistor M9 is turned on, the branch where the ninth transistor M9 is located generates a current $I_{clamp}$. At this point, the detection current received on the detection resistor Rs consists of $I_s$ and $I_{clamp}$. The width-to-length ratio of the ninth transistor M9 can be set to be M times the width-to-length ratio of the eighth transistor M8 so that the current $I_{clamp}$ generated by the branch where the ninth transistor M9 is located is M times the current of the eighth transistor M8. At this point, the voltage detected by the detection resistor Rs is:

$$V_{det} = R_s * (I_S + I_{clamp}) > V_{OCP}.$$

$R_S$ is the resistance value of the detection resistor $R_S$. In the second time period t2, $V_{det} > V_{OCP}$ is maintained. The comparator U2 does not invert, maintains the control of the peak current controller 32 on the overcurrent protection circuit, and controls the overcurrent protection circuit to work at lower power consumption.

Figure 8:
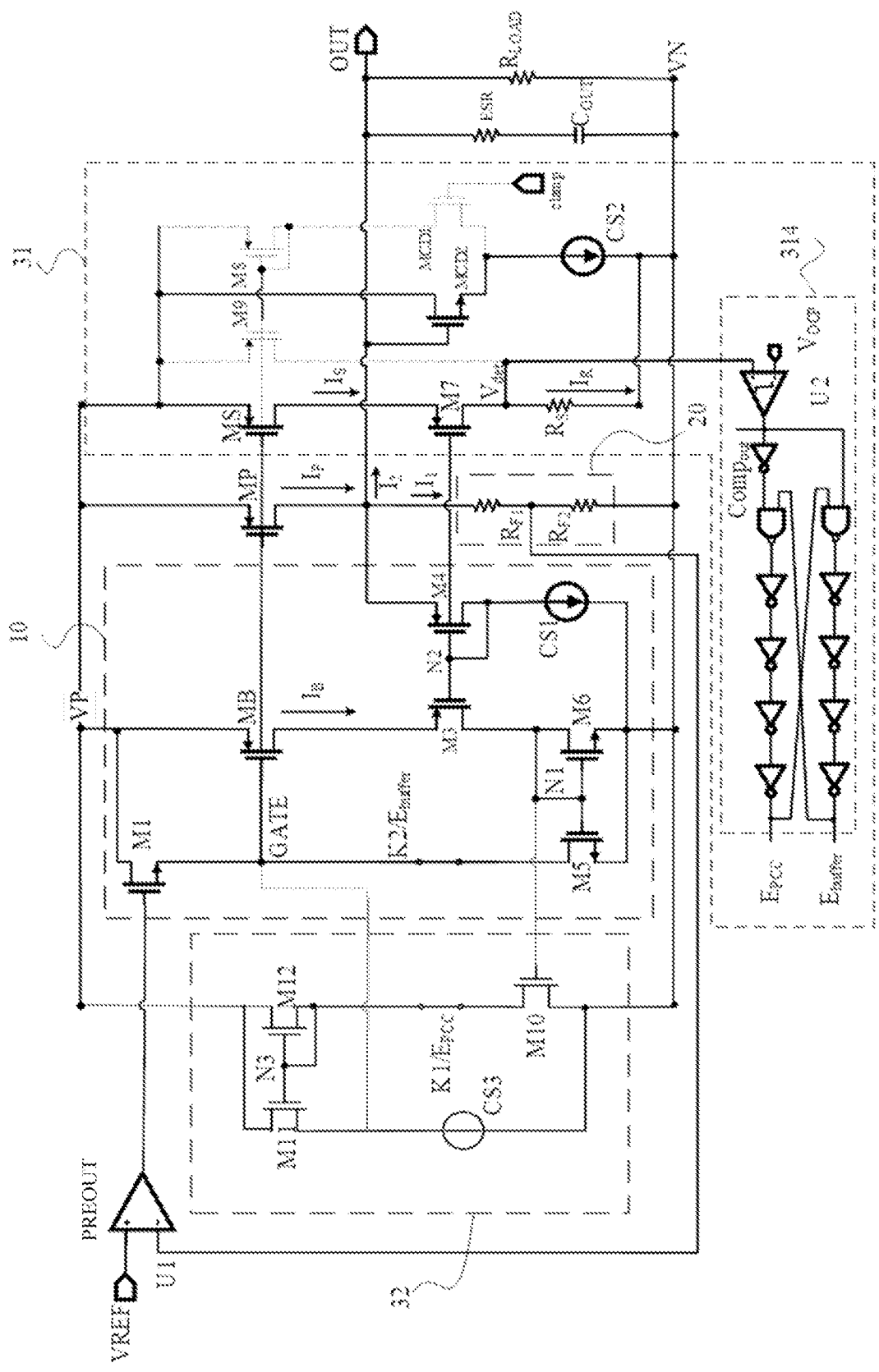
FIG. 8 is a circuit diagram of another overcurrent protection circuit according to an embodiment of the present disclosure.

For example, with reference to FIGS. 5 and 8, FIG. 8 is a schematic diagram of the overcurrent protection circuit working at the third time period t3 in which the external overload has just disappeared according to an embodiment of the present disclosure. In the third time period t3, when the overload of the output terminal OUT of the overcurrent protection circuit disappears or when the overload disappears, the overcurrent protection circuit enters the third time period t3, the output voltage of the first signal output terminal $E_{PCC}$ and the output voltage of the second signal output terminal $E_{buffer}$ are simultaneously at the high level, and the main loop controlled by the operational amplifier U1 and the peak current controller 32 simultaneously work.

In the third time period t3, the overload of the output terminal OUT of the overcurrent protection circuit disappears, the voltage of the output terminal OUT of the overcurrent protection circuit rises, and the voltage of the output terminal OUT of the overcurrent protection circuit is greater than the voltage of the clamp voltage terminal clamp, that is, $V_{OUT} > V_{clamp}$. At this time, the first comparison transistor MCD1 is turned off, and the second comparison transistor MCD2 is turned on. Since the first comparison transistor MCD1 is turned off, the branch where the eighth transistor M8 and the first comparison transistor MCD1 are located is disconnected, and both the eighth transistor M8 and the ninth transistor M9 are turned off. For the drive transistor MP, the current flowing through it decreases. The induced current $I_s$ of the first replication transistor MS also decreases, the detection resistor Rs only receives the induced current $I_S$ that decreases, and thus the detection voltage $V_{det}$ converted by the detection resistor Rs decreases. When $V_{det} = R_s * I_S < V_{OCP} - V_{hy}$, the comparator U2 of the hysteresis comparison circuit 314 inverts, and the output terminal COMPout changes from a high level to a low level.

Meanwhile, the hysteresis comparison circuit 314 controls the second signal provided by the second signal output terminal $E_{buffer}$ to change from a low level to a high level, and the second switch K2 is turned on. As the voltage of the output terminal OUT of the overcurrent protection circuit rises, the first current $I_1$ increases, the voltage at the first terminal of the second feedback resistor $R_{F2}$ increases, the voltage fed back to the inverting input terminal of the operational amplifier U1 increases, the voltage at the inverting input terminal of the operational amplifier U1 is greater than or equal to the voltage at the reference voltage terminal VREF, the voltage outputted from the output terminal PREOUT of the operational amplifier U1 to the gate of the first connection transistor M1 increases, and the first connection transistor M1 is turned on. The third time period t3 is the hysteresis inversion stage. The second signal provided by the second signal output terminal $E_{buffer}$ changes, the first signal provided by the first signal output terminal $E_{PCC}$ does not change and still remains at a high level to maintain the first switch K1 to be in a connection state, and the peak current controller 32 still controls the overcurrent protection circuit. At this point, the main loop controlled by the operational amplifier U1 and the peak current controller 32 can work simultaneously, the output terminal PREOUT of the operational amplifier U1 and the output terminal of the peak current controller 32 can jointly control the gate of the drive transistor MP, and the main loop controlled by the operational amplifier U1 and the peak current controller 32 jointly control the output of the output terminal OUT of the overcurrent protection circuit.

Figure 9:
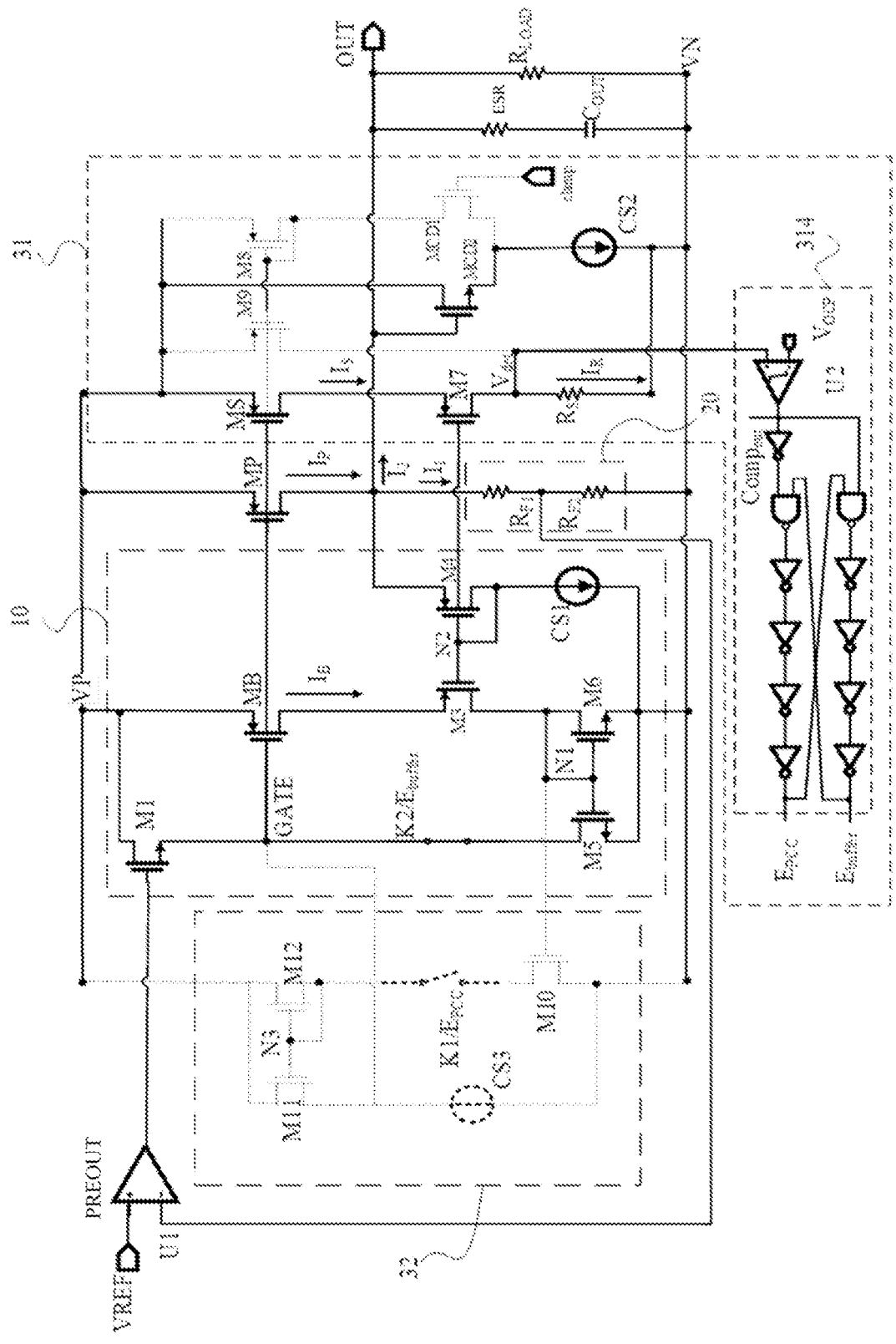
FIG. 9 is a circuit diagram of another overcurrent protection circuit according to an embodiment of the present disclosure.

FIG. 9 is a schematic diagram of the overcurrent protection circuit working in the fourth time period according to an embodiment of the present disclosure. With reference to FIGS. 5 and 9, in the fourth time period t4, the second signal generated by the second signal output terminal $E_{buffer}$ still outputs a high-level signal to maintain the second switch K2 to be turned on and maintain the connection state of the main loop controlled by the output terminal PREOUT of the operational amplifier U1. The first signal generated by the first signal output terminal $E_{PCC}$ has also changed to a low-level signal in the fourth time period t4 to control the first switch K1 to be turned off, the peak current controller 32 is turned off, the initiative of the overcurrent protection circuit is returned to the main loop controlled by the operational amplifier U1, the voltage of the output terminal OUT of the overcurrent protection circuit is restored to the set voltage, and the overcurrent protection circuit works in a normal working state.

For example, with reference to FIGS. 5 and 9, in the fourth time period t4, the voltage of the second signal output terminal $E_{buffer}$ is maintained at a high level, and the second switch K2 is turned on. The first signal output terminal $E_{PCC}$ changes from a high level to a low level, the first switch K1 is turned off, the branch where the first switch K1, the second connection transistor 10 and the twelfth transistor M12 are located is disconnected, and the second connecting transistor M10 and the twelfth transistor M12 are turned off. Since the eleventh transistor M11 and the twelfth transistor M12 constitute a current mirror, when the twelfth transistor M12 is turned off, the eleventh transistor M11 is also turned off. The second electrode of the eleventh transistor M11 is suspended cannot control the voltage of the gate control terminal GATE, at this point, the peak current controller 32 is turned off, and the output terminal PREOUT of the operational amplifier U1 controls the gate of the drive transistor MP to control the output of the output terminal OUT of the overcurrent protection circuit. The voltage of the output terminal OUT of the overcurrent protection circuit is larger than the voltage of the clamp voltage terminal clamp, the first comparison transistor MCD1 is turned off, the eighth transistor M8 and the ninth transistor M9 are turned off, and the second comparison transistor MCD2 is turned on, the current $I_{clamp}$ disappears, and at this point, the voltage detected by the detection resistor Rs is as follows:

$$V_{det} = R_s * I_S < V_{OCP} - V_{hy}.$$

In the fourth time period t4, $V_{det} < V_{OCP} - V_{hy}$ is maintained, and at this point, the comparator U2 does not invert.

In the fourth time period t4, due to the delay, the time when the level of the first signal output terminal $E_{PCC}$ are inverted is later than that of the second signal output terminal $E_{buffer}$.

Optionally, there is also a fifth time period t5 between the fourth time period t4 in which the output terminal OUT of the overcurrent protection circuit works normally and the first time period t1 in which the current is overloaded. With reference to FIG. 5, the fifth time period t5 is the delay inversion period. When the overload just occurs, when the detection voltage $V_{det}$ is greater than the reference voltage $V_{OCP}$, the comparator U2 is inverted, the output COMPout changes from a low level to a high level, but the signals outputted from the second signal output terminal $E_{buffer}$ and the first signal output terminal $E_{PCC}$ remain unchanged. Under the same normal working state as the pervious time period, the inversion of the signals outputted from the second signal output terminal $E_{buffer}$ and the first signal output terminal $E_{PCC}$ is delayed, and the inversion of the signals outputted from the second signal output terminal $E_{buffer}$ and the first signal output terminal $E_{PCC}$ is carried out when the whole overload state is stable, so that the working state of the whole circuit is more stable.

Figure 10:
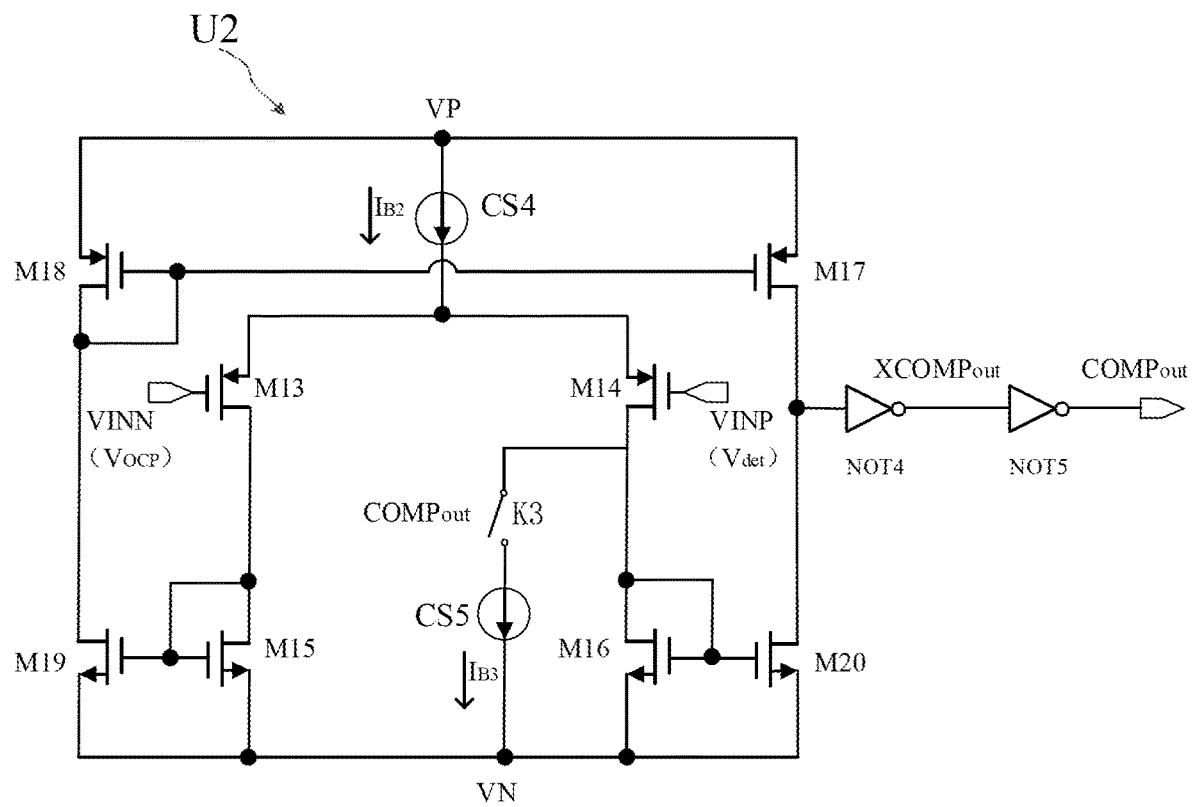
FIG. 10 is a circuit diagram of a comparator according to an embodiment of the present disclosure.

FIG. 10 is a circuit diagram of a comparator according to an embodiment of the present disclosure. With reference to FIGS. 4 and 10, the comparator U2 includes a thirteenth transistor M13, a fourteenth transistor M14, a fifteenth transistor M15, a sixteenth transistor M16, a seventeenth transistor M17, an eighteenth transistor M18, a nineteenth transistor M19, a twentieth transistor M20, a third switch K3, a fourth current source CS4, a fifth current source CS5, a fourth NOT gate circuit NOT4 and a fifth NOT gate circuit NOT5.

The gate of the thirteenth transistor M13 is electrically connected with a first comparison terminal VINN, and the first comparison terminal VINN may be electrically connected with the reference voltage terminal OCP and inputted with the reference voltage $V_{OCP}$. The first electrode of the thirteenth transistor M13 and the first electrode of the fourteenth transistor M14 are both electrically connected with the second terminal of the fourth current source CS4. The second electrode of the thirteenth transistor M13 is electrically connected with the first electrode of the fifteenth transistor M15. The gate of the fourteenth transistor M14 is electrically connected with a second comparison terminal VINP, and the second comparison terminal VINP may be electrically connected with the first terminal of the detection circuit Rs and inputted with the detection voltage $V_{det}$. The second electrode of the fourteenth transistor M14 is electrically connected with the first terminal of the third switch K3 and the first electrode of the sixteenth transistor M16. The first terminal of the fourth current source CS4 is electrically connected with the first power terminal VP. The gate of the fifteenth transistor M15 is electrically connected with the gate of the nineteenth transistor M19. The gate of the fifteenth transistor M15 is electrically connected with the first electrode of the fifteenth transistor M15. The second electrode of the fifteenth transistor M15 is electrically connected with the second power terminal VN. The gate of the sixteenth transistor M16 is electrically connected with the gate of the twentieth transistor M20. The first electrode of the sixteenth transistor M16 is electrically connected with the gate of the sixteenth transistor M16. The second electrode of the sixteenth transistor M16 is electrically connected with the second power terminal VN. The gate of the seventeenth transistor M17 is electrically connected with the gate of the eighteenth transistor M18, and both the first electrode of the seventeenth transistor M17 and the first electrode of the eighteenth transistor M18 are electrically connected with the first power terminal VP. The second electrode of the seventeenth transistor M17 is electrically connected with the first electrode of the twentieth transistor M20 and the input terminal of the fourth NOT gate circuit NOT4. The second electrode of the eighteenth transistor M18 is electrically connected with the gate of the eighteenth transistor M18 and the first electrode of the nineteenth transistor M19. The second electrode of the nineteenth transistor M19 is electrically connected with the second power terminal VN. The second electrode of the twentieth transistor M20 is electrically connected with the second power terminal VN. The second terminal of the third switch K3 is electrically connected with the first terminal of the fifth current source CS5, and the control terminal of the third switch K3 is electrically connected with the output terminal COMPout of the comparator U2. The second terminal of the fifth current source CS5 is electrically connected with the second power terminal VN. The output terminal XCOMPout of the fourth NOT gate circuit NOT4 is electrically connected with the input terminal of the fifth NOT gate circuit NOT5, and the output terminal of the fifth NOT gate circuit NOT5 is electrically connected with the output terminal COMPout of the comparator U2.

For example, with reference to FIG. 10, in the comparator U2, the thirteenth transistor M13 and the fourteenth transistor M14 constitute a differential pair, the fifteenth transistor M15, the sixteenth transistor M16, the nineteenth transistor M19 and the twentieth transistor M20 each are load transistors, and the seventeenth transistor M17 and the eighteenth transistor M18 are output transistors. When the detection voltage $V_{det}$ inputted to the second comparison terminal VINP is greater than the reference voltage $V_{OCP}$ inputted to the first comparison terminal VINN, the thirteenth transistor M13 is turned on, and the current generated by the fourth current source CS4 flows through the branches where the thirteenth transistor M13 and the fifteenth transistor M15 are located. The nineteenth transistor M19 replicates the current of the fifteenth transistor M15, the eighteenth transistor M18 and the nineteenth transistor M19 have the same current, and the seventeenth transistor M17 replicates the current of the eighteenth transistor M18. The fourteenth transistor M14 is turned off, the current generated by the fourth current source CS4 does not flow through the fourteenth transistor M14, the sixteenth transistor M16 and the twentieth transistor M20 have no current, the voltage at the second electrode of the seventeenth transistor M17 is pulled high, and the voltage at the output terminal COMPout changes from a low level to a high level.

When the detection voltage $V_{det}$ inputted to the second comparison terminal VINP is less than the reference voltage $V_{OCP}$ inputted to the first comparison terminal VINN, the thirteenth transistor M13 is turned off, the current generated by the fourth current source CS4 does not flow through the thirteenth transistor M13, and the fifteenth transistor M15, the eighteenth transistor M18 and the seventeenth transistor M17 have no current. The fourteenth transistor M14 is turned on, the current generated by the fourth current source CS4 flows through the fourteenth transistor M14, the branch where the sixteenth transistor M16 is located is connected, the twentieth transistor M20 replicates the current of the sixteenth transistor M16, the voltage at the second electrode of the seventeenth transistor M17 is pulled low, and the voltage at the output terminal COMPout changes from a high level to a low level. When the voltage of the output terminal COMPout becomes at a high level, the third switch K3 is controlled to be turned on, and the current generated by the fourth current source CS4 is divided into two branches after flowing through the fourteenth transistor M14. The first branch passes through the sixteenth transistor M16. The second branch passes through the third switch K3 and the fifth current source CS5. Due to the shunt effect of the third switch K3, the current flowing through the sixteenth transistor M16 decreases, and a hysteresis voltage $V_{hy}$ is generated from the moment when the thirteenth transistor M13 starts to be turned off to the moment when the thirteenth transistor M13 is completely turned off.

Figure 11:
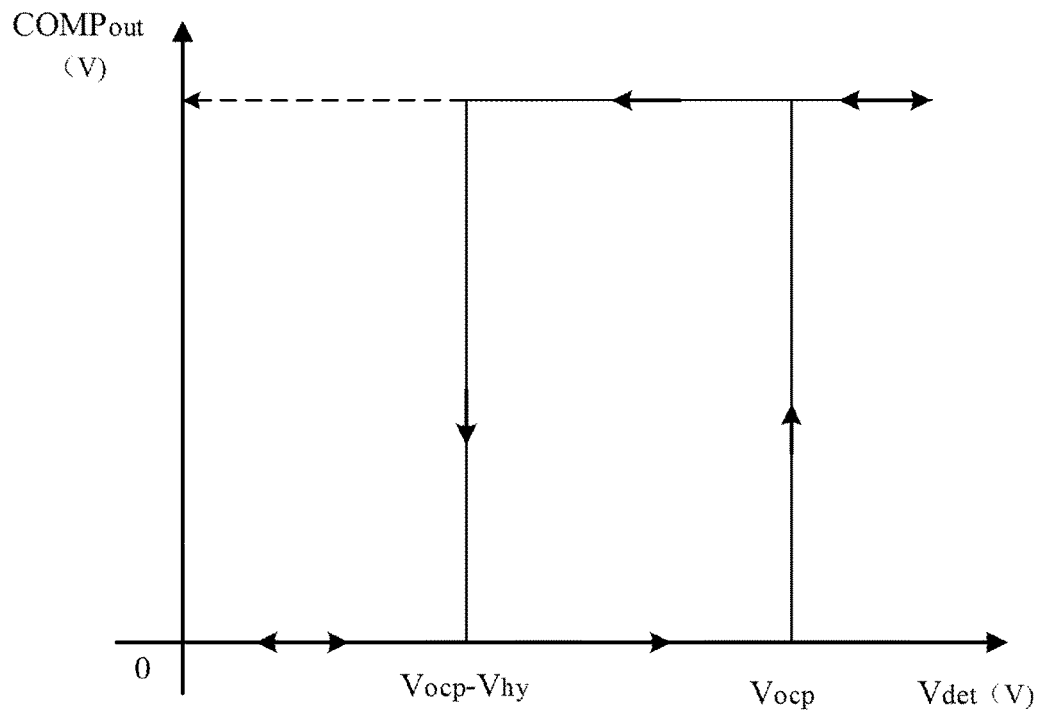
FIG. 11 is a hysteresis curve diagram of a comparator according to an embodiment of the present disclosure.

FIG. 11 is a hysteresis curve diagram of a comparator according to an embodiment of the present disclosure. With reference to FIGS. 5 and 10, when the voltage at the output terminal COMPout of the comparator U2 changes from a low level to a high level, the current $I_{B3}$ will be transmitted into the forward loop $$(\text{where } I_{B3} = \frac{1}{N} * I_{B2})$$

so that the comparator U2 generates a hysteresis voltage $V_{hy}$, which can be expressed as follows:

$$V_{hy} = \sqrt{\frac{(N+1)I_{B2}}{N\mu C_{OX}\left(\frac{W}{L}\right)_2}} + |V_{TH2}| - \sqrt{\frac{(N-1)I_{B2}}{N\mu C_{OX}\left(\frac{W}{L}\right)_1}} - |V_{TH1}|. \quad (1)$$

Assuming that the thirteenth transistor M13 and the fourteenth transistor M14 have the same width-to-length ratio and have identical characteristics, Formula (1) can be simplified as:

$$V_{hy} = \sqrt{\frac{I_{B2}}{N\mu C_{OX}\frac{W}{L}}}\left(\sqrt{N+1} - \sqrt{N-1}\right). \quad (2)$$

In Formula (2), μ is the carrier mobility, $C_{OX}$ is the oxide layer capacitance per unit area, and $$\left(\frac{W}{L}\right)$$

is the width-to-length ratio of the thirteenth transistor M13 and the fourteenth transistor M14.

As can be seen from the above, when the detection voltage $V_{det}$ is higher than the reference voltage $V_{OCP}$, the voltage at the output terminal COMPout of the comparator U2 changes from a low level to a high level. When the detection voltage $V_{det}$ is lower than ($V_{OCP}-V_{hy}$), the voltage at the output terminal COMPout of the comparator U2 changes from a high level to a low level.

When the overload current at the output terminal OUT of the overcurrent protection circuit disappears, the first replication transistor MS detects that the current at the output terminal decreases and feeds the detection back to the detection resistor Rs, and at this point, the generated detection voltage is:

$$V_{det}=R_s*(I_S+I_{clamp})<V_{OCP}-V_{hy}.$$

$R_S$ is the resistance value of the detection resistor $R_S$. The comparator U2 inverts again, the output voltage of the first signal output terminal $E_{PCC}$ changes from a high level to a low level, the output voltage of the second signal output terminal $E_{buffer}$ changes from a low level to a high level, and the initiative of the overcurrent protection circuit is returned to the main loop controlled by the operational amplifier U1. At this point, the peak current controller 32 is turned off, the first connection transistor M1 controls the gate control terminal GATE to restore to a lower voltage value, which enhance the ability of the drive transistor MP and pulls the voltage Vout of the output terminal OUT of the overcurrent protection circuit back to the preset output voltage value, that is, $V_{OUT}>V_{clamp}$, then the peak current detector 31 is turned off, the current $I_{clamp}$ disappears, the detection voltage meets: $V_{det}=R_s*I_s<<V_{OCP}-V_{hy}$, where the symbol "<<" means far less than, the SPCC circuit 30 is completely turned off, and the overcurrent protection circuit returns to the normal working state.

Figure 12:
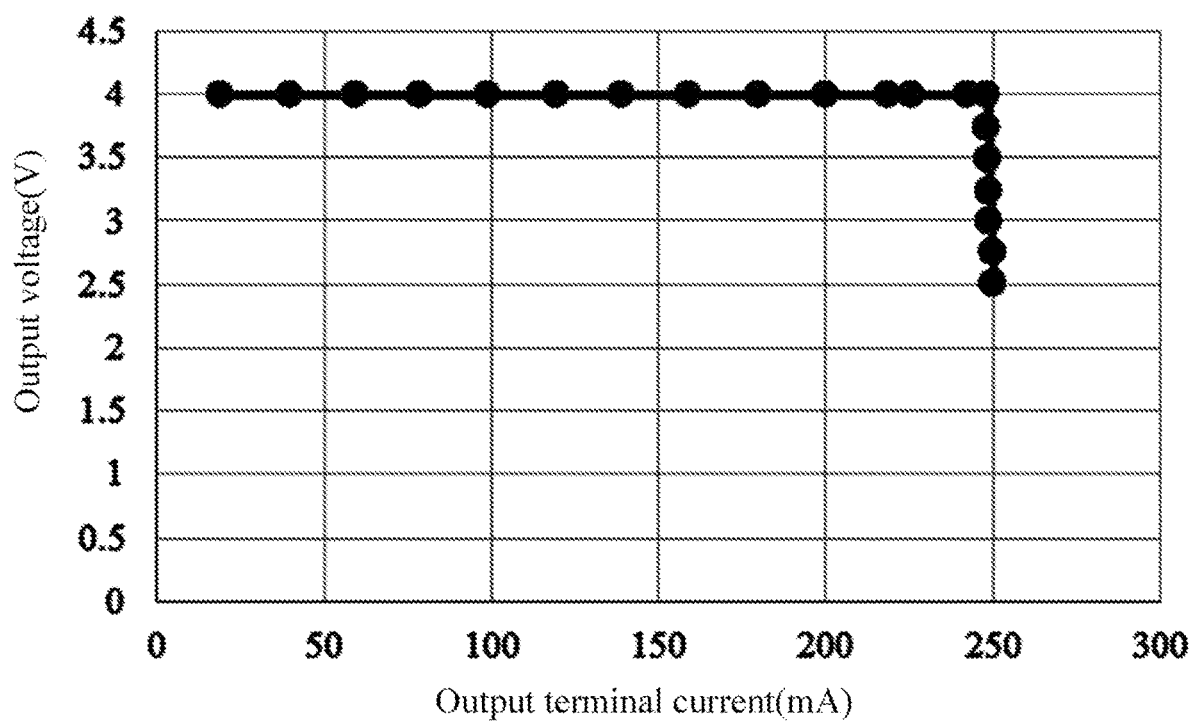
FIG. 12 is a schematic diagram of the curve of the output voltage varying with the current according to an embodiment of the present disclosure.

FIG. 12 is a schematic diagram of the curve of the output voltage varying with the current according to an embodiment of the present disclosure. With reference to FIG. 12, the output terminal current refers to the current at the output terminal OUT of the overcurrent protection circuit. The output voltage refers to the voltage at the output terminal OUT of the overcurrent protection circuit. The output terminal current increases from 0 mA to 500 mA, and the output voltage decreases from 4 V to 2.254 V. As can be seen from FIG. 12, the overload current of the output terminal OUT of the overcurrent protection circuit is limited to about 250 mA and will not increase with the increase of the overload current, thereby effectively reducing the power consumption in the case of overload.

Figure 13:
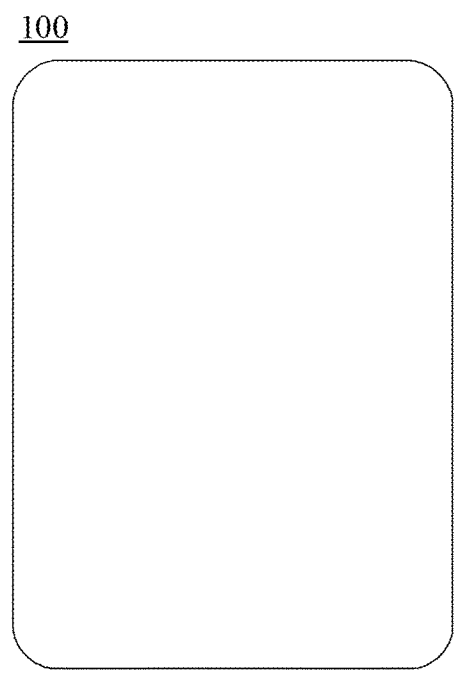
FIG. 13 is a structural diagram of a display device according to an embodiment of the present disclosure.

An embodiment of the present disclosure further provides a display device. FIG. 13 is a structural diagram of a display device according to an embodiment of the present disclosure. With reference to FIG. 13, the display device 100 provided by the embodiment of the present disclosure includes any overcurrent protection circuit provided above. Since the display device 100 adopts the overcurrent protection circuit described above, the display device 100 also has the beneficial effects of the overcurrent protection circuit of the above-mentioned embodiments. It is to be noted that the display device provided by the embodiment of the present disclosure may also include a display panel and other circuits and devices supporting the normal working of the display device. The display device can be one of a mobile phone, a tablet computer, electronic paper and an electronic photo frame, and can also be a near-eye display device such as a virtual reality display device, an augmented reality display device, a helmet display device, intelligent glasses and the like. Optionally, the display device is a silicon micro-display device.

It is to be noted that the preceding are only preferred embodiments of the present disclosure and technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. An overcurrent protection circuit, comprising: a drive transistor, an operational amplifier, a buffer, a peak current detector, and a peak current controller;
   wherein
   a gate of the drive transistor is electrically connected with a gate control terminal of the buffer, a first electrode of the drive transistor is electrically connected with a first power terminal, and a second electrode of the drive transistor is electrically connected with an output terminal of the overcurrent protection circuit;
   an output terminal of the operational amplifier is connected with the buffer, and the operational amplifier controls the drive transistor through the buffer;

an output terminal of the peak current controller is electrically connected with the gate control terminal of the buffer; and the peak current detector is configured to detect whether an overload current exists at the output terminal of the overcurrent protection circuit; wherein, in response to the overload current being detected, the overcurrent protection circuit enters a first time period, and the operational amplifier and the peak current controller are configured to jointly control the gate of the drive transistor;

in response to a second time period after the first time period, a main loop controlled by the operational amplifier is disconnected, and the peak current controller is configured to control the gate of the drive transistor;

in response to no overload current being detected, the overcurrent protection circuit enters a third time period, and the operational amplifier and the peak current controller are configured to jointly control the gate of the drive transistor; and in response to a fourth time period, the operational amplifier is configured to control the gate of the drive transistor.

2. The overcurrent protection circuit according to claim 1, wherein upon detecting the presence of the overload current, the peak current detector controls the operational amplifier and the peak current controller to jointly control the gate of the drive transistor; and upon detecting the disappearance of an overload current, the peak current detector controls the operational amplifier and the peak current controller to jointly control the gate of the drive transistor.

3. The overcurrent protection circuit according to claim 1, wherein the peak current controller comprises a first switch, and the buffer comprises a second switch;

the peak current detector controls the peak current controller to control the gate of the drive transistor through controlling the first switch to be turned on and controls the peak current controller to stop controlling the gate of the drive transistor through controlling the first switch to be turned off; and the peak current detector controls the operational amplifier to control the gate of the drive transistor through controlling the second switch to be turned on and controls the operational amplifier to stop controlling the gate of the drive transistor through controlling the second switch to be turned off.

4. The overcurrent protection circuit according to claim 3, wherein the peak current detector comprises a hysteresis comparison circuit which comprises a first signal output terminal and a second signal output terminal;

the first signal output terminal is configured to output a first signal to control the first switch to be turned on or off; and the second signal output terminal is configured to output a second signal to control the second switch to be turned on or off.

5. The overcurrent protection circuit according to claim 4, wherein the peak current detector further comprises a first replication transistor, an overload feedback circuit, and a detection circuit; wherein the first replication transistor is configured to provide a first induced current which is proportional to a current of the drive transistor;

the overload feedback circuit is configured to provide a feedback current;

the detection circuit is configured to provide a detection voltage according to both the first induced current and the feedback current and transmit the detection voltage to the hysteresis comparison circuit, and the hysteresis comparison circuit controls the first signal output terminal to output a first signal and the second signal output terminal to output a second signal according to the detection voltage.

6. The overcurrent protection circuit according to claim 5, wherein the overload feedback circuit comprises a comparison input circuit which comprises a first comparison transistor and a second comparison transistor and a third current mirror circuit;

a gate of the second comparison transistor is connected with an output terminal of the current protection circuit, a gate of the first comparison transistor is connected with a clamp voltage terminal, a first electrode of the first comparison transistor is connected with the third current mirror circuit, a first electrode of the second comparison transistor is connected with the first power terminal, and a second electrode of the first comparison transistor is connected with both a second electrode of the second comparison transistor and a second power terminal;

the comparison input circuit turns on the third current mirror circuit in response to a voltage of the clamp voltage terminal being greater than or equal to a voltage of the output terminal of the overcurrent protection circuit, and turns off the third current mirror circuit in response to the voltage of the clamp voltage terminal is less than the voltage of the output terminal of the overcurrent protection circuit;

in response to the third current mirror circuit being turned on, the overload feedback circuit provides a feedback current.

7. The overcurrent protection circuit according to claim 5, wherein the peak current detector further comprises a seventh transistor disposed between the first replication transistor and the detection circuit.

8. The overcurrent protection circuit according to claim 6, wherein the peak current detector further comprises a second current source, wherein the second current source is connected between the second electrode of the first comparator transistor and the second power terminal.

9. The overcurrent protection circuit according to claim 5, wherein the hysteresis comparison circuit comprises a comparator, a first NOT gate circuit, a first NAND gate circuit, a plurality of second NOT gate circuits, a second NAND gate circuit, and a plurality of third NOT gate circuits; wherein a number of the plurality of second NOT gate circuits is equal to a number of the plurality of third NOT gate circuits;

a non-inverting input terminal of the comparator is electrically connected with a first terminal of the detection circuit, an inverting input terminal of the comparator is electrically connected with a reference voltage terminal, and an output terminal of the comparator is electrically connected with an input terminal of the first NOT gate circuit;

an output terminal of the first NOT gate circuit is electrically connected with a first input terminal of the first NAND gate circuit;

a second input terminal of the first NAND gate circuit is electrically connected with a second signal output terminal, and an output terminal of the first NAND gate circuit is electrically connected with a first signal output terminal through a plurality of the second NAND gate circuits connected in series;

a first input terminal of the second NAND gate circuit is electrically connected with the first signal output terminal, a second input terminal of the second NAND gate circuit is electrically connected with the output terminal of the comparator, and an output terminal of the second NAND gate circuit is electrically connected with the second signal output terminal through a plurality of third NAND gates connected in series.

10. The overcurrent protection circuit according to claim 9, wherein according to a change of the detection voltage, when the comparator changes a signal of the output terminal, a change of a first signal outputted from the first signal output terminal and a change of a second signal outputted from the second signal output terminal are later than the change of the signal of the output terminal of the comparator.

11. The overcurrent protection circuit according to claim 3, wherein the buffer further comprises a first connection transistor, a second replication transistor, and a stable current circuit; wherein a gate of the first connection transistor is connected with the output terminal of the operational amplifier, a first electrode of the first connection transistor is electrically connected with the first power terminal, and a second electrode of the first connection transistor is connected with the gate control terminal;

a first terminal of the second switch is connected with the gate control terminal, and a second terminal of the second switch is connected with the stable current circuit;

a gate of the second replication transistor is connected with the gate control terminal, a first electrode of the second replication transistor is connected with the first electrode of the first connection transistor, and a second electrode of the second replication transistor is connected with the stable current circuit.

12. The overcurrent protection circuit according to claim 11, wherein the stable current circuit further comprises a first current mirror circuit, a second current mirror circuit, and a first current source.

13. The overcurrent protection circuit according to claim 12, wherein the first current mirror circuit comprises a third transistor and a fourth transistor whose gates are connected with each other, and the second current mirror circuit comprises a fifth transistor and a sixth transistor whose gates are connected with each other;

a first electrode of the third transistor is connected with a second electrode of the second replication transistor, and a second electrode of the third transistor is connected with a first electrode of a sixth transistor; a first electrode of the fourth transistor is electrically connected with the output terminal of the overcurrent protection circuit, a second electrode and a gate of the fourth transistor are both connected with a first terminal of the first current source, and a second terminal of the first current source is connected with a second electrode of the sixth transistor;

a gate of the sixth transistor is connected with a first electrode of the sixth transistor, a second electrode of the fifth transistor is connected with the second electrode of the sixth transistor, and a first electrode of the fifth transistor is connected with the second terminal of the second switch.

14. The overcurrent protection circuit according to claim 3, wherein the peak current controller further comprises a second connection transistor and a fourth current mirror circuit; wherein a first electrode of the second connection transistor is connected with a second terminal of the first switch, and a second electrode of the second connection transistor is connected with the second power terminal;

a first terminal of the first switch is connected with the fourth current mirror circuit, and the fourth current mirror circuit is also connected with the gate control terminal.

15. The overcurrent protection circuit according to claim 14, wherein the fourth current mirror circuit comprises an eleventh transistor and a twelfth transistor whose gates are connected with each other; wherein a first electrode of the eleventh transistor and a first electrode of the twelfth transistor are connected with the first power terminal, a second electrode of the eleventh transistor is connected with the gate control terminal, a second electrode of the twelfth transistor is connected with the first terminal of the first switch, and a gate of the twelfth transistor is also connected with the second electrode of the twelfth transistor.

16. The overcurrent protection circuit according to claim 15, wherein the current controller further comprises a third current source, wherein a first terminal of the third current source is connected with the second electrode of the eleventh transistor, and a second terminal of the third current source is connected to the second electrode of the second connection transistor.

17. The overcurrent protection circuit according to claim 1, further comprising a feedback circuit, wherein a first terminal of the feedback circuit is connected with the second electrode of the drive transistor, and a second terminal of the feedback circuit is connected with an inverting input terminal of the operational amplifier; the feedback circuit is used for feeding back a change of a feedback voltage caused by a change of a current flowing through the drive transistor to the inverting input terminal of the operational amplifier; the operational amplifier changes a voltage of the output terminal of the operational amplifier according to the change of the feedback voltage.

18. A display device, comprising an overcurrent protection circuit which comprises a drive transistor, an operational amplifier, a buffer, a peak current detector, and a peak current controller; wherein a gate of the drive transistor is electrically connected with a gate control terminal of the buffer, a first electrode of the drive transistor is electrically connected with a first power terminal, and a second electrode of the drive transistor is electrically connected with an output terminal of the overcurrent protection circuit;

an output terminal of the operational amplifier is connected with the buffer, and the operational amplifier controls the drive transistor through the buffer;

an output terminal of the peak current controller is electrically connected with the gate control terminal of the buffer; and the peak current detector is configured to detect whether an overload current exists at the output terminal of the overcurrent protection circuit; wherein, in response to the overload current being detected, the overcurrent protection circuit enters a first time period, and the operational amplifier and the peak current controller are configured to jointly control the gate of the drive transistor;

in response to a second time period after the first time period, a main loop controlled by the operational amplifier is disconnected, and the peak current controller is configured to control the gate of the drive transistor;

in response to no overload current being detected, the overcurrent protection circuit enters a third time period, and the operational amplifier and the peak current controller are configured to jointly control the gate of the drive transistor; and in response to a fourth time period, the operational amplifier is configured to control the gate of the drive transistor.

19. The display device according to claim 18, wherein the display device is a silicon micro-display device.

* * * * *